US006737158B1

(12) United States Patent
Thompson

(10) Patent No.: US 6,737,158 B1
(45) Date of Patent: May 18, 2004

(54) POROUS POLYMERIC MEMBRANE TOUGHENED COMPOSITES

(75) Inventor: Samuel A. Thompson, Wilmington, DE (US)

(73) Assignee: Gore Enterprise Holdings, Inc., Newark, DE (US)

( * ) Notice: Subject to any disclaimer, the term of this patent is extended or adjusted under 35 U.S.C. 154(b) by 35 days.

(21) Appl. No.: 10/284,396

(22) Filed: Oct. 30, 2002

(51) Int. Cl.[7] .................................................. B32B 3/06
(52) U.S. Cl. ............................... 428/306.6; 428/304.4; 428/308.4; 428/307.3; 428/315.5; 428/316.6; 428/317.1; 428/320.2; 428/322.7; 428/421; 428/900; 257/701; 257/702; 174/126.2; 204/296; 89/36.05; 89/36.02
(58) Field of Search ..................... 428/306.6, 304.4, 428/308.4, 307.3, 315.5, 316.6, 317.1, 320.2, 322.7, 421, 900; 257/701, 702; 174/126.2; 204/296; 89/36.05, 36.02

(56) References Cited

U.S. PATENT DOCUMENTS

| 3,953,566 A | | 4/1976 | Gore .......................... 264/288 |
| 4,784,901 A | | 11/1988 | Hatakeyama et al. ........ 428/268 |
| 5,036,551 A | * | 8/1991 | Dailey et al. .................. 2/167 |
| 5,288,547 A | | 2/1994 | Elmes et al. ............. 428/308.4 |
| 5,374,473 A | * | 12/1994 | Knox et al. .................. 428/218 |
| 5,471,906 A | * | 12/1995 | Bachner, Jr. et al. ...... 89/36.05 |
| 5,476,589 A | | 12/1995 | Bacino .................. 210/500.36 |
| 5,494,301 A | * | 2/1996 | Hamilton et al. ........... 277/652 |
| 5,527,838 A | * | 6/1996 | Afzali-Ardakani et al. . 523/223 |
| 5,545,475 A | | 8/1996 | Korleski .................. 428/306.6 |
| 5,547,551 A | | 8/1996 | Bahar et al. ................. 204/296 |
| 5,731,073 A | | 3/1998 | Knott et al. ............. 428/304.4 |
| 5,753,358 A | | 5/1998 | Korleski .................. 428/308.4 |
| 5,766,750 A | | 6/1998 | Korleski .................. 428/308.4 |
| 5,847,327 A | * | 12/1998 | Fischer et al. ............... 174/258 |
| 5,879,794 A | * | 3/1999 | Korleski, Jr. ............ 428/317.1 |
| 5,907,113 A | | 5/1999 | Hebestreit et al. ............. 84/297 |
| 5,922,453 A | * | 7/1999 | Horn, III et al. ........... 428/325 |
| 5,947,918 A | * | 9/1999 | Jones et al. .................... 602/58 |
| 6,071,600 A | * | 6/2000 | Rosenmayer ............... 428/213 |
| 6,143,401 A | | 11/2000 | Fischer et al. ........... 428/322.7 |
| 6,184,589 B1 | * | 2/2001 | Budnaitis et al. ........... 257/690 |
| 6,248,942 B1 | | 6/2001 | Hebestreit et al. ............. 84/297 |
| 6,644,040 B1 | * | 11/2003 | Robbie et al. ............... 62/50.2 |
| 6,668,868 B2 | * | 12/2003 | Howland et al. ....... 139/383 R |

* cited by examiner

Primary Examiner—Bruce F. Bell
(74) Attorney, Agent, or Firm—Kevin J. Boland

(57) ABSTRACT

Composites comprising porous polymeric membrane films meeting the following equation: 75 MPa<(longitudinal membrane tensile modulus+transverse membrane tensile modulus)/2, wherein at least a portion of the porosity of the membrane is imbibed with resin and methods for making the same. The composites have unusually high resistance to fracture and catastrophic failure.

99 Claims, 16 Drawing Sheets

POROUS POLYMERIC MEMBRANE TOUGHENED COMPOSITES

BACKGROUND OF THE INVENTION

1. Field of the Invention

The invention relates to the use of certain porous polymeric membranes to toughen composite structures.

2. Description of Related Art

Toughness is a term used to refer to a material's ability to adapt to, and ability to handle, stress. Tougher materials withstand greater stress prior to failure. Toughness often also implies failure that is more ductile in nature and non-catastrophic, characterized by inelastic and energy absorbing processes preceding failure. Frequently used metrics for toughness include but are not limited to fracture energy measurements, impact energy measurements, strength, puncture strength, impact strength, and strength after impact.

Related art in toughened composites includes rubber toughening of polymers, and composite reinforcement with fibrous material (chopped or continuous glass, aramid fibers, carbon fibers, etc.).

Rubber toughening is a term applied to materials toughened by the presence of a second and discrete rubber phase in a polymeric matrix. These rubber domains are believed to act as stress concentrators, acting to dissipate stress on a microscopic level and increase matrix toughness. Toughness is used herein to describe the ability to absorb energy in a non catastrophic manner. The rubber domains are typically generated by either a phase separation phenomenon or by addition of individual rubber particles. When added as individual rubber particles these particles are often in the form of core-shell rubbers where an outer shell is present over the rubber core. The shell is typically made from a material having a glass transition temperature above room temperature. The shell functions to prevent clumping and aid in dispersion. Rubber toughening can be accompanied by a drop in matrix glass transition temperature, a drop in resin modulus, or both simultaneously. Rubber toughening typically loses its effectiveness as the Tg of thermoset resins increases above 150° C. as a result of the high cross-link density and inability of molecules to move without breakage in response to stress.

Thermoplastics that have been rubber toughened to enable applications beyond those available to the brittle neat polymer include polyvinyl chloride, polystyrene, acetal polymers including polyoxymethylene. Thermoset resins that have been rubber toughened include epoxy resins of low glass transition temperature.

Other polymers better known for their inherent toughness have also been enhanced by rubber toughening. Rubber toughened polycarbonate, and nylon, fall into this group.

Composite reinforcement in the traditional sense typically means increasing the overall stiffness of the matrix such that a composite can carry greater load with less deflection than the neat resin matrix. This reinforcement also often acts to increase the toughness of the material in that significantly more energy is required to generate a catastrophic failure than that of the neat resin matrix. Reinforcement is typically accomplished by addition of high modulus fibers such as glass, aramid, ceramic, or carbon fibers. These fibers typically fall in the 1–20 um diameter range. The coarseness of the fibrous reinforcement can limit applications, as for example in electronics where feature size can be on the order of one to several microns. To effectively boost stiffness and toughness in a polymeric composite the fibrous reinforcement is typically bonded to the resin to facilitate stress transfer from resin to fiber. This bond can be mechanical as in interlocking on a rough surface like that of carbon fiber, or it can be chemical as in covalent interaction between resin and fiber surface. This bonding is often enhanced with a reactive surface treatment to improve mechanical performance.

The prior art also discloses the use of polytetrafluoroethylene (PTFE) as composite reinforcement.

For example, it is known to prepare fibers from expanded PTFE, the fibers are used to produce fabrics that are then impregnated with thermosetting resins for use in printed circuit boards. These structures are not membrane structures and the fibers reinforce the resin on a macroscopic scale.

Also known is the use of fibrillated PTFE mixed with thermoplastic materials as well as thermosetting resins, wherein the fibrillated PTFE is discontinuous.

Composites have also been formed by the addition of fibrillated PTFE to a molybdenum disulfide and thermoplastic elastomer blend for improved abrasion resistance, solvent resistance and useful life and strength. Again, in such composites the PTFE is discontinuous.

The prior art also shows composites of fluorine containing elastomer and a fibrillated PTFE. The PTFE is discontinuous.

U.S. Pat. No. 3,953,566 to Gore discloses production of a form of PTFE known as expanded polytetrafluoroethylene (ePTFE), which is a porous membrane film of interconnected voids formed by nodes and fibrils. The void space in the ePTFE material comprises at least 50% of the volume, and frequently more than 70%. ePTFE is often a higher strength material than PTFE, and it is also an excellent dielectric material.

The use of such ePTFE porous membrane films to form composites is also known. For example, U.S. Pat. No. 5,753,358 to Korleski discloses an adhesive composite material comprising an ePTFE material having interconnected nodes and fibrils, wherein at least a portion of the void content of the material is imbibed with a particulate filled resin adhesive.

U.S. Pat. No. 4,784,901 to Hatakeyama et al. discloses flexible printed circuit board base materials comprising a sheet of porous, ePTFE impregnated with a bismaleimide-triazine resin. The sheet of porous, ePTFE comprises interconnected nodes and fibrils and voids.

U.S. Pat. No. 5,547,551 to Bahar et al. discloses ultra-thin composite membranes which include a base material and an ion exchange resin. The base material is a membrane which is defined by a thickness of less than 1 mil (0.025 mm) and a microstructure characterized by nodes and fibrils and voids, or in an alternative embodiment, by fibrils and voids with no nodes present. The ion exchange resin substantially impregnates the membrane such that the membrane is essentially air impermeable. Bahar discusses the improved performance of ion exchange membranes containing ePTFE over ion exchange resins without ePTFE. Important performance criteria discussed are uniformity and occlusiveness as in free of pin holes and air impermeability, mechanical integrity, and long term chemical stability. The membranes operate in the water swollen state where the ion exchange resin is highly swollen, soft and rubbery. Bahar indicates that a preferred base material is an expanded PTFE made in accordance with the teachings of U.S. Pat. No. 3,593,566.

U.S. Pat. No. 5,476,589 to Bacino discloses a non-woven web that is a thin, porous polytetrafluoroethylene membrane consisting essentially of a non-woven web having a microstructure of substantially only microfibrils fused at crossover points. The non-woven web is unusually strong, unusually thin, has unusually small pore sizes, but a very high air flow-through. It has a pore size between 0.05 and 0.4 micrometers; a bubble point between 10 and 60 psi; a pore size distribution value between 1.05 and 1.20; a ball burst strength between 0.9 and 17 pounds/force; and air flow of between 20 Frazier and 10 Gurley seconds; a thickness between 1.0 and 25.4 micrometers; and a fiber diameter ranging between 5 and 200 nm.

U.S. Pat. No. 5,288,547 to Elmes et al. discloses a process for preparing a composite using a porous membrane film component that enhances toughness in the obtained composite. Elmes et al. teach that the thermoplastic membrane dissolves into the composite and that it would be undesirable to not have the thermoplastic membrane dissolve into the composite. Elmes et al. also state that a weak resin-thermoplastic interface is a problem as it has a negative effect on composite performance.

The entire disclosure of each of the above U.S. Patents is hereby incorporated by reference.

Moreover, MICROLAM® 410 Dielectric and MICROLAM® 610 Dielectric are two commercially available products available from W.L. Gore & Associates, Newark, Del. These products are composites of thermoset resins and ePTFE porous membranes. MICROLAM® 410 Dielectric also contains a large volume fraction of inorganic filler and the membrane component generally has a maximum tensile modulus of 133 MPa and a tensile modulus of 1 MPa at 90 degrees from the direction of the maximum tensile modulus. FIG. 5 is an SEM of the type of membrane used in this product. MICROLAM® 610 Dielectric has a membrane component which generally has a maximum tensile modulus of 76 MPa and a tensile modulus of 16 MPa at 90 degrees from the direction of the maximum tensile modulus. FIG. 6 is an SEM of the type of membrane used in this product.

It is also known to produce materials including substantially node-free ePTFE membranes having the porosity at least partially imbibed with fluorinated ethylene propylene ("FEP"). FEP has a room temperature flexural modulus of about 0.5 to 0.7 GPa. Node free membranes imbibed with FEP typically exhibit a room temperature flexural modulus ratio of FEP/FEP-membrane composite of about 0.6.

SUMMARY OF THE INVENTION

The invention relates to the use of porous polymeric membrane films in composites such that these membranes provide substantially improved resistance to fracture and catastrophic failure in the composite. As used herein "composite" means a body comprising two or more distinct materials. This toughening, in contrast to traditional rubber toughening is independent of the glass transition of the resin used. As used herein "porous polymeric membrane film" means a porous polymeric film, the pores of which are substantially interconnected. The porous polymeric membrane film is insoluble in that it remains intact and undissolved during processing of the composite.

The porous polymeric membrane film satisfies the following equation:

75 MPa<(longitudinal membrane tensile modulus+transverse membrane tensile modulus)/2.

In an aspect of the invention the composites include resin having a room temperature (23° C.) flexural modulus of greater than about 1 GPa imbibed into at least a portion of the porosity of the membrane. The resin can be any suitable inorganic or organic material or a combination thereof which has a room temperature flexural modulus of greater than about 1 GPa. Suitable inorganic materials include, for example, metals, metalloids, and ceramics. Suitable organic materials include, for example, polymeric materials.

In a further aspect of the invention, the ratio of the room temperature flexural modulus of the resin to the room temperature flexural modulus of the composite, measured in the direction of the higher of the transverse and longitudinal moduli, is greater than or equal to about 1.

Toughening with such a membrane structure does not affect the glass S transition temperature (Tg) of the resin. Moreover, the Tg of the final composite is the same as the Tg of the neat resin without membrane. The impact on composite flexural and tensile modulus will depend upon the volume fraction of the membrane and the flexural and tensile moduli of the matrix and membrane. Because the membrane is a distinct and separate phase from the matrix, in contrast with rubber toughening, lowering of the flexural or tensile modulus by incomplete phase separation cannot occur.

It has been unexpectedly discovered that when used in a composite structure, porous polymeric membrane structures according to the invention contribute significantly to the fracture toughness of the composite. In an aspect of the invention the membrane structure is an expanded polytetrafluoroethylene membrane that has minimal material present in non-fibrillar form, termed "nodes". In a further aspect of the invention the membrane is substantially void of nodal material. Isotropic fibril orientation is preferred when stress may be loaded from multiple directions. When stress is anisotropic it is preferred that the greater number of fibrils be parallel to the direction of maximum stress. When multiple layer structures are contemplated, cross plying of the layers may be desirable to maximize performance. One measure of fibril orientation and density is the membrane tensile modulus. Membranes having higher moduli are preferred.

Unlike traditional high modulus fiber reinforcements (e.g., glass, carbon, .etc.), the membranes of this invention have substantially non-linear, membrane-like structures. In the specific case of expanded polytetrafluoroethylene membranes the membrane does not readily wet or bond to other materials. Contrary to what the prior art teaches in the selection of a toughener or reinforcement material, the membranes of the invention unexpectedly provide enhanced composite performance.

Traditional reinforcements also provide for and act by substantially increasing the modulus in the composite over that of the neat resin alone. Carbon, graphite, glass, ceramic, and aramid fibers for example can increase the modulus of the composite by greater than a factor of 10.

In an aspect of the invention, composite room temperature flexural moduli measured in the direction of the higher of the membrane transverse and longitudinal moduli, are typically lower than the room temperature flexural modulus of the resin component alone.

DESCRIPTION OF THE DRAWINGS

The present invention should become apparent from the following description when considered in conjunction with the accompanying drawings, in which.

DETAILED DESCRIPTION OF THE INVENTION

Figure 1:
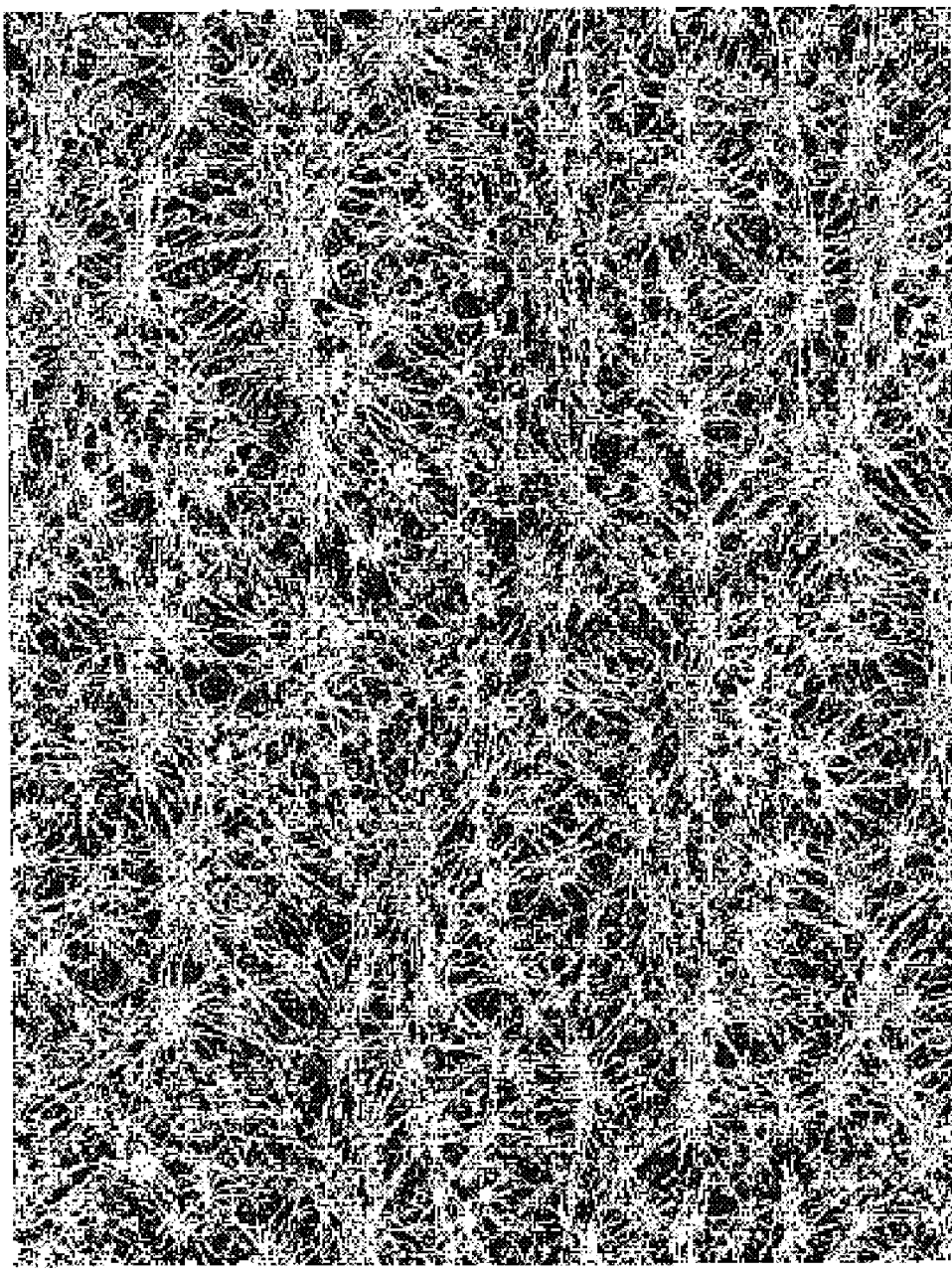
FIG. 1 is a Scanning Electron Micrograph taken at 2000× magnification of the membrane used in Comparative Example 1.

The invention relates to the use of specific porous polymeric membrane films in combination with resin to provide toughening in composites, the composite structures themselves, the method of making these composites, and their use in articles and applications of commerce.

As stated above, the resin can be any suitable inorganic or organic material or a combination thereof. In an aspect of the invention, the resin has a room temperature flexural modulus of greater than about 1 GPa. Suitable inorganic materials include, for example, metals, metalloids, and ceramics. Suitable organic materials include, for example, polymeric materials. If the resin is an organic material it may also include non-polymeric components, such as inorganic materials. For example, if an organic material such as a polymeric material is used, the polymeric material can also include (e.g., be combined with, mixed with, or have dispersed therein) a ceramic and/or metal and/or metalloid material. The resin, whether inorganic, organic, or a combination thereof, has a room temperature flexural modulus of greater than about 1 GPa. It should be understood that as used herein "resin" includes all of the materials present in the resin component of the composite. Thus, it is possible that when the resin is a combination of two or more components, one of the components of the resin (e.g. a polymeric material) could have a room temperature flexural modulus of less than about 1 GPa, but if the combination of the two components (e.g. combination of polymeric material and ceramic filler) results in a material having a room temperature flexural modulus of greater than about 1 GPa, then the resin is according to the invention.

It has been unexpectedly found that composites with desirable properties can be produced by imbibing a resin having a room temperature flexural modulus of greater than about 1 GPa into at least a portion of the porosity of a high tensile modulus porous polymeric membrane film.

In a further aspect of the invention the ratio of the room temperature flexural modulus of the resin to the room temperature flexural modulus of the composite, measured in the direction of the higher of the membrane transverse and longitudinal moduli, is greater than or equal to about 1. In this aspect of the invention the room temperature flexural modulus of the resin may or may not be greater than about 1 GPa.

The porous polymeric membrane film meets the following equation:

$$75 \text{ MPa} < (\text{longitudinal membrane tensile modulus} + \text{transverse membrane tensile modulus})/2.$$

Membranes satisfying 100 MPa<(longitudinal membrane tensile modulus+transverse membrane tensile modulus)/2 are more preferred. Membranes satisfying 150 MPa< (longitudinal membrane tensile modulus+transverse membrane tensile modulus)/2 are even more preferred. Membranes satisfying 250 MPa<(longitudinal membrane tensile modulus+transverse membrane tensile modulus)/2 are even more preferred. Membranes satisfying 300 MPa< (longitudinal membrane tensile modulus+transverse membrane tensile modulus)/2 are even more preferred. Membranes satisfying 400 MPa<(longitudinal membrane tensile modulus+transverse membrane tensile modulus)/2 are most preferred. Membranes having tensile moduli>200 MPa in all directions are the most preferred.

The membrane may contain organic and inorganic components. Membranes comprising polymeric materials are preferred. Membranes comprising stretched polymers are preferred. Membranes comprising expanded PTFE are the most preferred. The polymeric membrane may comprise virtually any polymeric material, for example vinyl polymers, styrene, acrylate, methacrylate, polyethylenes, polypropylenes, polyacrylonitrile, polyacrylarnide, poly vinyl chloride, fluoropolymers including PTFE, condensation polymers, polysulfone, polyimides, polyamides, polycarbonates, polysulfides, polyesters, polyanhydrides, polyacetals, polyurethanes, polyurea, cellulose, cellulose derivatives, polysaccharides, pectinic polymers and derivatives, alginic polymers and derivatives, chitin and derivatives, phenolics, aldehyde polymers, polysiloxanes, derivatives, copolymers and blends thereof.

The porous polymeric membrane film may be made by known methods. Preferred are ePTFE membranes having minimal nodal material. Most preferred are node-free ePTFE membranes. Such ePTFE membranes can be made, for example, according to the teachings of U.S. Pat. No. 5,476,589 to Bacino. Such membranes are formed through biaxial expansion of PTFE so as to create a membrane that is highly fibrillated—essentially eliminating coarse nodal structure. As a result, the structure comprises an extremely strong web of fine fibrils intersecting at fibril cross-over points. Representative of such structures can be seen in the S.E.M. of FIG. 13. Large node structures, such as those described and illustrated in U.S. Pat. No. 3,953,566, to Gore, are absent from such membrane films. Representative of structures formed according to the teachings of U.S. Pat. No.

Figure 6:
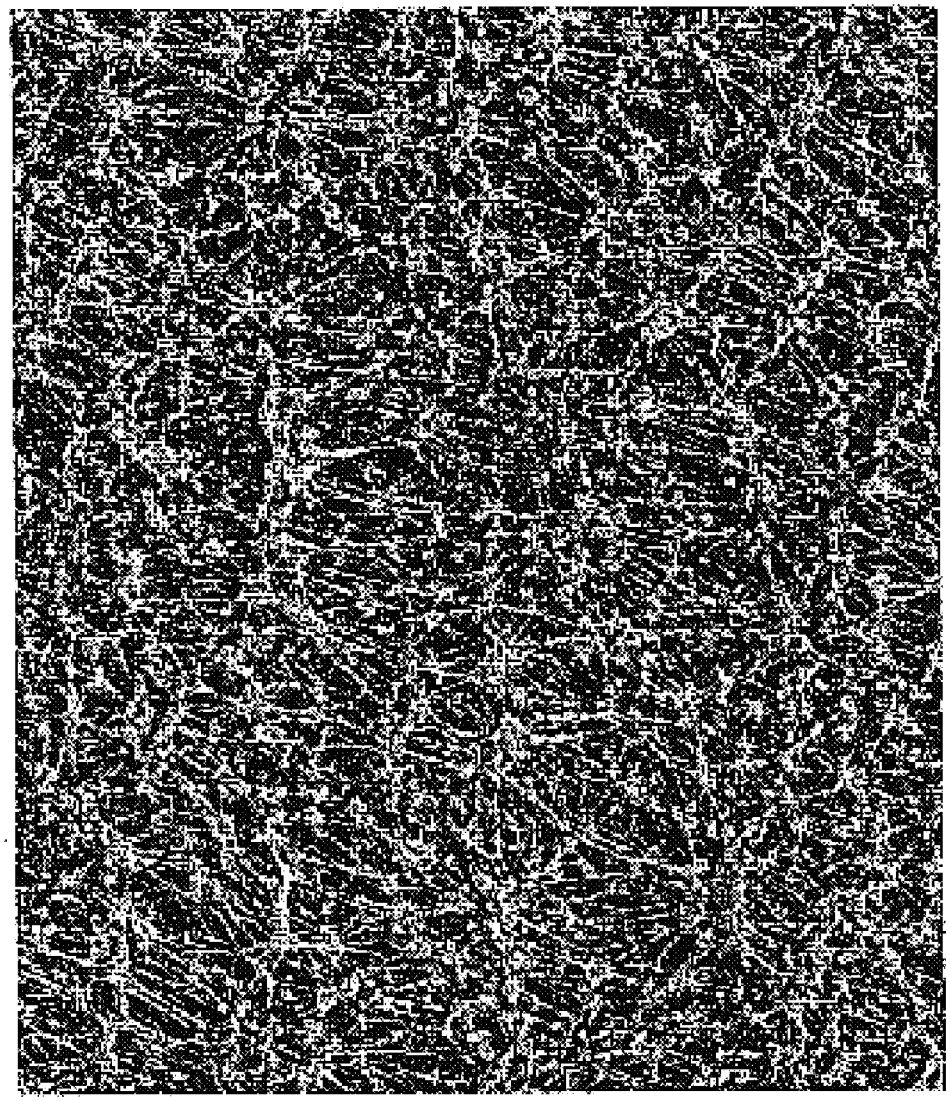
FIG. 6 is a Scanning Electron Micrograph taken at 2000× magnification of the membrane used in Comparative Example 6.

3,953,566 can be seen in the S.E.M. of FIG. 6 where large nodes and fibrils are clearly seen.

The expanded PTFE material according to U.S. Pat. No. 5,476,589 may be made in the following manner. A PTFE fine powder that has a low amorphous content and a degree of crystallization of at least 98% is used as the raw material. Suitable PTFE fine powders include, for example, FLUON® CD-123 and FLUON® CD-1 fine powders available from ICI Americas, Inc., and TEFLON® fine powders available from E.I. duPont de Nemours and Co., Inc. The PTFE fine powder is first coagulated and then lubricated with a hydrocarbon extrusion aid, preferably an odorless mineral spirit such as ISOPAR® K (available from Exxon Corp.). The lubricated powder is compressed into cylinders and extruded in a ram extruder to form tapes. Two or more layers of tape can be stacked together and compressed between two rolls. The tape or tapes are compressed between rolls to an appropriate thickness, e.g., 0.1 to 1 mm, or so. The wet tape is stretched traversely to 1.5 to 5 times its original width. The extrusion aid is driven off with heat.

The dried tape is then expanded longitudinally between banks of rolls in a space heated to a temperature that is below the polymer melting point (327° C.). The longitudinal expansion is such that the ratio of speed of the second bank of rolls to the first bank-of rolls is 10–100 to 1. The longitudinal expansion is repeated at a 1–1.5 to 1 ratio.

Next, the tape, after the longitudinal expansion, is expanded traversely at a temperature that is less than 327° C. to at least 1.5 times and preferably to 6 to 15 times the input width of the original extrudate while restraining the membrane from longitudinal contraction. While still under constraint, the membrane is preferably heated to above the polymer melting point (327° C.) and is then cooled.

Particularly preferred membranes are such node-free ePTFE membranes having a high density of fibrils oriented in the direction of maximum stress in the intended composite body. Isotropic fibril orientation is preferred when stress may be loaded from multiple directions.

The ePTFE membranes may have any suitable void content. In an aspect of the invention the membrane can have a void content of from about 1% to about 99.5% by volume. In a further aspect of the invention, the void content can be from about 50% to about 90%. With a preferred void content of from about 70–90%.

The membrane may optionally facilitate or be treated to facilitate bonding to the resin component. Example treatments include corona, plasma, chemical oxidation, etc.

To form the composites of the invention resin is imbibed into at least a portion of the porosity of the membrane. Polymeric resins are preferred and include thermoplastic resins, thermoset resins, and combinations or mixtures thereof. In an aspect of the invention the resin is polymeric and has a glass transition temperature in the amorphous component of >80° C.

Suitable thermoplastic resins include, for example, vinyl polymers, styrene, acrylate, methacrylate, certain polyethylenes, polypropylenes, polyacrylonitrile, polyacrylamide, poly vinyl chloride, certain fluoropolymers, and combinations thereof. Moreover, suitable thermoset resins include, for example, epoxy, cyanate ester, bis maleimide, phenolics, unsaturated resins such as unsaturated polyesters, hydrosilation resins, polydicyclopentadiene, polyurethanes, polysulfide, acetylenic resins, polyanhydrides, melamine, alkyds, ureas, isocyanates, and combinations thereof. Particularly preferred polymeric resins include thermoset resins including epoxy resins, cyanate esters, and combinations thereof.

The resins may also include one or more suitable filler materials. In an aspect of the invention the filler is dispersed evenly in the resin. Filler materials can be in any suitable form, such as particulate or fiber form. The filler can be any suitable inorganic and/or organic material or combinations thereof. For example, metals and alloys such as, but not limited to, nickel, copper, aluminum, silicon, solder, silver, gold, metal-plated materials such as silver-plated copper, silver-plated nickel, silver-plated glass, etc., are useful. Moreover, inorganics such as $BaTiO_3$, $SrTiO_3$, $SiO_2$, $Al_2O_3$, BN, ZnO, $TiO_2$, MnO, CuO, $Sb_2O_3$, WC, fused silica, fumed silica, amorphous fused silica, sol-gel silica, sol-gel titanates, mixed titanates, lithium-containing ceramics, hollow glass microspheres, carbon-based materials such as carbon, activated charcoal, carbon black, ketchem black, diamond powder, etc., are also useful. Particularly preferred fillers include $BaTiO_2$, $SiO_2$, $Al_2O_3$, ZnO, $TiO_2$, nickel and solder.

The selection of optional filler (and the amount thereof) will depend on the desired properties of the final composite body. For example, by selecting the proper filler, composite properties such as conductivity, resistivity, modulus, strength, impact behavior, thermal expansion, damping, weather resistance, wear resistance, weight (either increase or decrease final weight of composite), lubricity, friction, color, finish, sound reflection—absorption—amplification, insulation, toughness, etc., may be controlled.

Fillers may optionally be surface treated to improve composite performance. Examples of suitable surface treatments include but are not limited to silanes, zirconates and titanates and the like. These agents may act as wetting agents, processing aids, flame retardants, colorants, etc.

Generally, it is desirable to fill as much of the membrane porosity with resin as is possible. Preferably, the porosity is essentially filled with resin. However, desirable composites can be formed which include a substantial amount of porosity. In this regard, preferred void contents of the final composite may range from about 0% to about 70% by volume.

Any suitable method or process may be used to imbibe the membrane with resin. For example, resin may be imbibed into the membrane by one or more combinations of solvent impregnation, melt impregnation, monomer infiltration, and film lamination. Imbibing may be assisted by solvent, temperature, pressure, and vacuum and any combination thereof designed to aid in getting the resin into the membrane.

The form of the composite and method of manufacture of articles can be in any of the forms and methods known in the art, for example sheet molding, prepreg lay-up, compression molding, thermoforming, tape wrap, extrusion and molding starting with particulated membrane and/or particulated membrane-resin composite, injection molding of resin or resin monomer into membrane preforms, stamping, pultrusion, machining, etc. In one embodiment the composite form is in sheets that are subsequently sheet molded into articles. In yet another embodiment the resin-membrane composite preform is particulated by grinding, cutting, cryogenic grinding, or any other means of preparing small composite pieces, and then fed into a mold via powder metering or through an extruder into a mold to make a final part. Heat and pressure may optionally be applied to flow the resin and/or provide thermal energy for curing chemistries. In yet another embodiment membrane particulate is combined with resin to make a molded article. In a preferred embodiment articles are made from sheets of resin-membrane composite combined with the use of heat and pressure.

Once the composite is formed, the composite will have many end uses that will now be apparent to the skilled artisan. The composite will be useful in electronics applications, such as a dielectric material. Thus, it may be desirable to laminate, or otherwise join, the composite to one or more metal layers (such as aluminum, copper, gold, tin, silver, lead, etc.). Moreover, it may be desirable to laminate, or otherwise join, the composite to one or more capacitance layers (for example, ceramic filled polymers).

The composite is also useful in combination with one or more layers of high modulus fiber containing materials, such as glass fibers, carbon fibers, and ceramic fibers. In this regard, the composite of the invention can be laminated to, for example, a layer of a high modulus fiber containing material to add toughness to such a material. Such laminates are particularly useful as structural materials, as well as in aerospace applications, defense applications, and sporting goods applications.

For example, fishing, hunting, golf, tennis, skiing, track and field, basketball, football, soccer, lacrosse, and hockey related sporting goods materials such as rods, bows, arrow shafts, clubs, rackets, sticks, skis and poles, javelins, helmets, pole vault poles, backstops, and posts can be fabricated using the composites of the invention. Thus, the present invention includes sporting goods equipment comprising composites of the invention. Aerospace materials applications include, for example, interior and exterior aircraft-panels, flight critical parts, non-flight critical parts, safety devices, fan blades, control surfaces, struts, and the like can also be fabricated using the composites of the invention. Thus, the present invention includes aerospace parts comprising composites of the invention. Defense materials applications include structural members, armor panels for personal or vehicle defense (e.g., body armor plate apparel such as vest armor and helmet armor, vehicle armor such as armor plating for personnel carrier and tank sacrificial armor tiles), and military equipment housings.

Further, it may be desirable to laminate together two or more of the inventive composites to form relatively thicker composites. Moreover, in an aspect of the invention, the composite can be used as an inner layer of a composite structure. The composite can serve as an interface adhesive layer, adhering together two layers in a composite structure, such as a laminate. Moreover, the composite can serve as an outer layer of a laminate. Thus, the invention also provides a novel laminate comprising at least one layer of the composite described above. In such embodiments the composites of the invention are particularly attractive due to their toughness. Specifically, during the lamination process an operator will, generally, handle the composite material (for example, a dielectric material) to be laminated to, for example, a copper substrate. A potential problem with this procedure is that currently used dielectric materials are known to have a propensity to crack prior to, or during, lamination and during end use due to stress induced chemically, mechanically, thermally, or combinations thereof. This can result in lower production efficiencies, wasted materials, failed parts, etc. By providing the toughened composites of the invention, the cracking problem will be greatly reduced.

End uses for the composites of the invention include, for example, use in electronic applications, prepreg, cores, thin cores, and ultra thin cores used in electronic substrates, printed circuit boards, chip package substrates, silicon wafers, and outer layer on composite structures. In an-aspect of the invention the composite can be used in forming electronic chip packages, which are well known to the skilled artisan. Such electronic chip packages comprise a laminated substrate having at least one conductive layer and at least one dielectric layer bonded to the conductive layer. Such packages can include a multitude of alternating conductive/dielectric layers and can additionally include one or more vias therein.

Further applications for the composites include, for example, use in stress bearing applications including but not limited to civil engineering, automotive, marine, trains, home and commercial appliance, radome, construction, manufacturing, furnishings, filtration, toys, dental including dental implants, medical including medical implants, wire wrapping, and like industries.

Properties enhanced include but are not limited to strength, toughness, impact resistance, damage resistance, damage tolerance, abrasion resistance, puncture resistance, etc.

Although the membrane enhances the toughness of resins across the spectrum from those that are very brittle to those that are extremely tough, in one preferred embodiment of this invention the membrane is used to enhance the toughness of resins that exhibit brittle failure in the absence of the membrane. Brittle failure is defined as a fracture failure characterized by a substantially linear stress strain curve until failure or a characteristically smooth and substantially featureless fracture surface. Enhanced toughness in these brittle materials greatly increases the latitude with which these materials can be applied in articles of commerce, enabling the use of lower cost, lower molecular weight and easier to process resin components.

EXAMPLES

Examples 1–9 and Comparative Examples 1–7

Expanded PTFE membranes were impregnated with resin A or B as noted in Tables 1 and 2. The composites were formed as follows. A prepreg was laid up unidirectionally to prepare ⅛" (0.32 cm) thick plaques as described below, cured, and then fracture specimens cut from these plaques and fracture energy measured in three point bend configuration following a modified ASTM D5045. Specifically, specimen dimensions were 2.5" (6.4 cm)×0.5" (1.27 cm)× 0.125" (0.32 cm) with a central precrack of approximately 40–60% of the 0.5" dimension. Prior to testing a fresh razor blade was used to scribe a sharp crack into the specimen. Kq was calculated using equation A1.4.3 in ASTM D 5045 using peak load in the stress strain curve as Kq. Kq is a measure of the stress intensity required for crack advancement. Testing was performed in a three-point bend configuration with a span of 2.0" (5.08 cm) and a cross-head speed of 0.1 mm/sec. Kq was measured in longitudinal and transverse directions on the plaque and indicated by crack direction in x and y direction, respectively. Membrane tensile modulus was also measured in longitudinal and transverse directions.

Membranes used in Examples 1–9 (according to the invention) are characterized as having small nodes and/or being substantially node-free membrane structures and further described by membrane tensile modulus, as set forth in Table 2. Membranes used in the Comparative Examples 1–7 (not according to the invention) are characterized as having node and fibril membrane structures and further described by membrane tensile modulus, as set forth in Table 1. Impregnation of the membranes was accomplished by running the membrane through a methyl ethyl ketone solution of the respective resin followed by drying off of the solvent in an air circulation oven. Plaques were prepared by laying up the prepreg inside a ⅛" thick frame mold maintaining membrane direction in each ply. The mold was covered with PTFE film on both sides and pressed at 200 psi (1.378 KPa) until cured. After curing the PTFE film was removed from both sides of the composite. Cure cycle for resin A was 2 hours at 350° F. (177° C). Cure cycle for Resin B was 1 hour at 350° F. (177° C.) followed by 2 hours at 435° F. (244° C.).

Resin A included the ingredients below and had a Tg of 130° C. and a room temperature flexural modulus of 2.96 GPa Room temperature flexural modulus of Resin A was measured using a 3 point bend test geometry on a Rheometrics Solid Analyzer RSA II. The sample was tested over a frequency range of 0.1 to 15 Hz. The reported flexural modulus was taken as the modulus at 1 Hz. The sample was measured using a strain of 0.02%. All testing was done at ambient conditions.

Resin A

| Ingredient | Percent by weight | Supplier |
|---|---|---|
| DER 538 A80 Epoxy resin | 94.6 | Eastech, Philadelphia PA |
| XB4399A70 Multi-functional epoxy resin | 3.2 | Vantico, Brewster NY |
| 2 methyl imidazole | 0.1 | Fisher Scientific, Pittsburgh, PA |
| Dicyan diamide | 2 | Sigma Aldrich, Milwaukee, WI |
| FC430 Surfactant | 0.1 | 3M, Saint Paul MN |

Resin B included the ingredients below and had a Tg of 215° C. and a room temperature flexural modulus of 4.9 GPa The room temperature modulus of resin B was measured using strain gauges on a sample measuring about ⅛" thick, about ½" wide, and about 1¼" long. Measurement conditions followed ASTM D790 with an adjusted span of 1".

Resin B

| Ingredient | Percent by weight | Supplier |
|---|---|---|
| PT30 Cyanate ester resin | 49.2 | Lonza, Fairlawn, NJ |
| GY2600 Epoxy resin | 9.5 | Vantico, Brewster NY |
| ECN 1871 Epoxy novolac resin | 37.8 | Ciba Geigy, Brewster NY |
| Irganox 1010 Antioxidant | 1.5 | Ciba Geigy, Brewster NY |
| Ba-59P Flame retardant | 2 | Great Lakes Chemical, West Lafayette IN |

Tables 1 and 2 list the corresponding Figure showing an SEM of the membrane used, the composite Kq for each of the composites formed, the membrane tensile moduli data, the resin used to form the composite, and the weight percent of ePTFE in the composite.

TABLE 1

Figure 2:
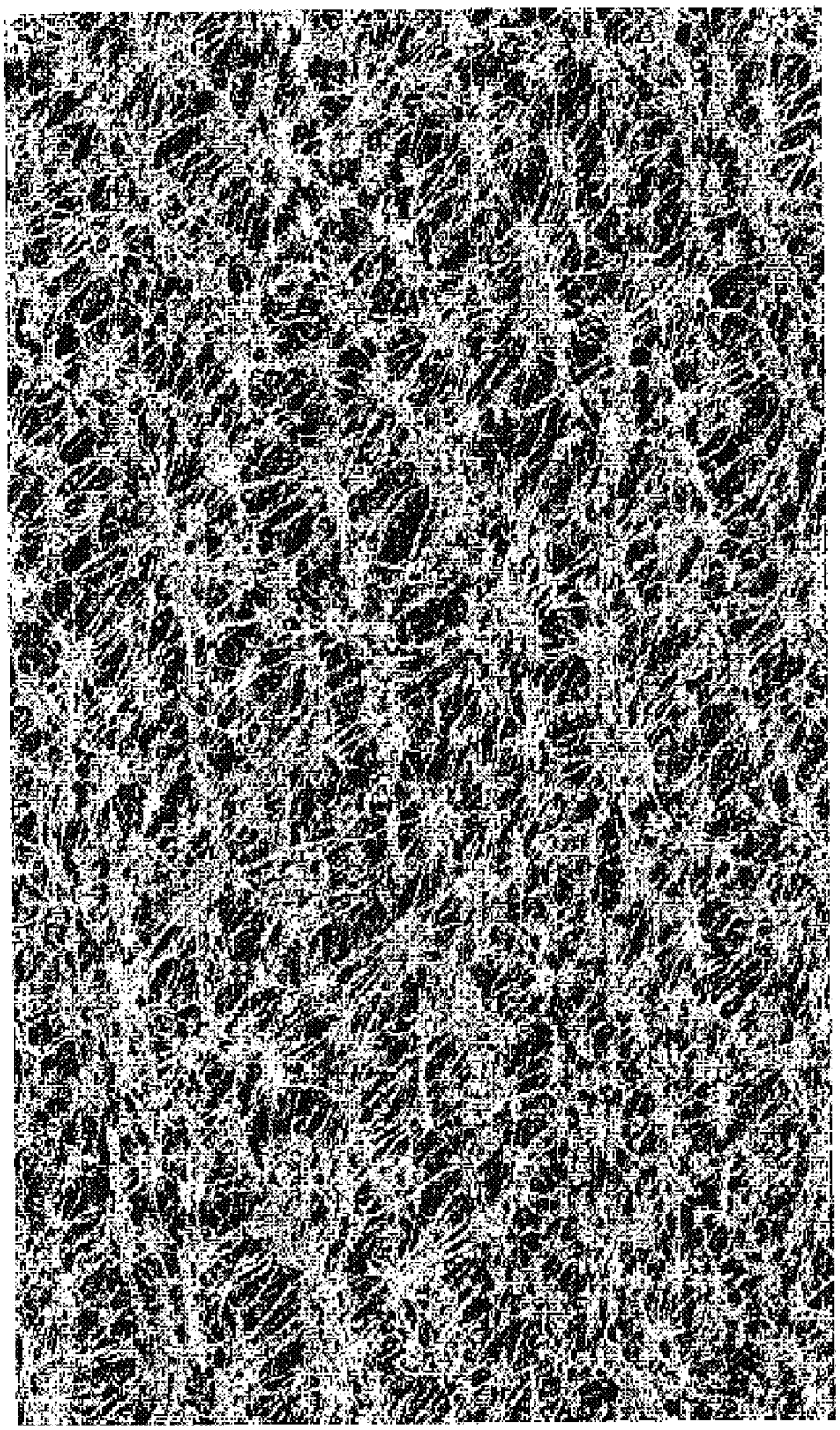
FIG. 2 is a Scanning Electron Micrograph taken at 2000× magnification of the membrane used in Comparative Example 2.
Figure 3:
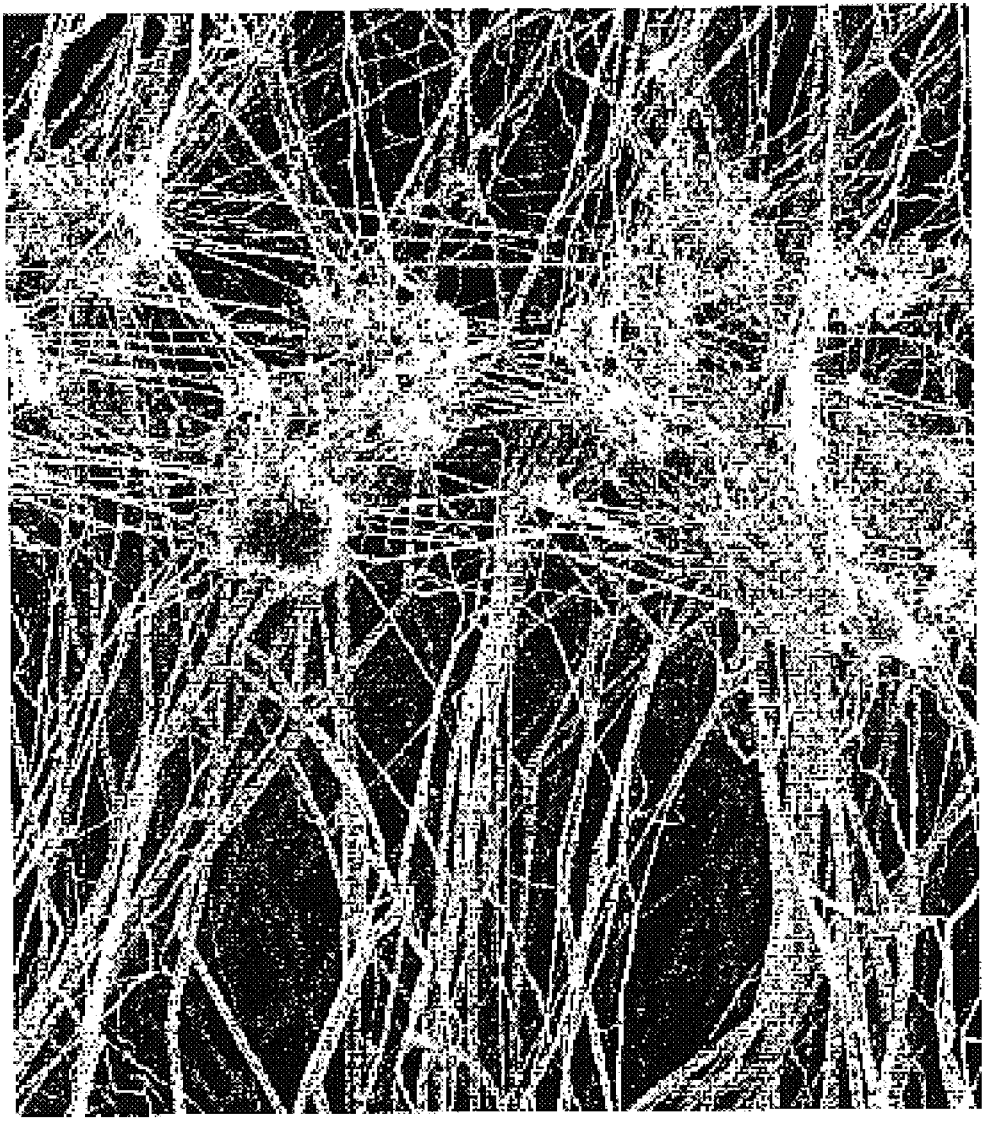
FIG. 3 is a Scanning Electron Micrograph taken at 2000× magnification of the membrane used in Comparative Example 3.
Figure 4:
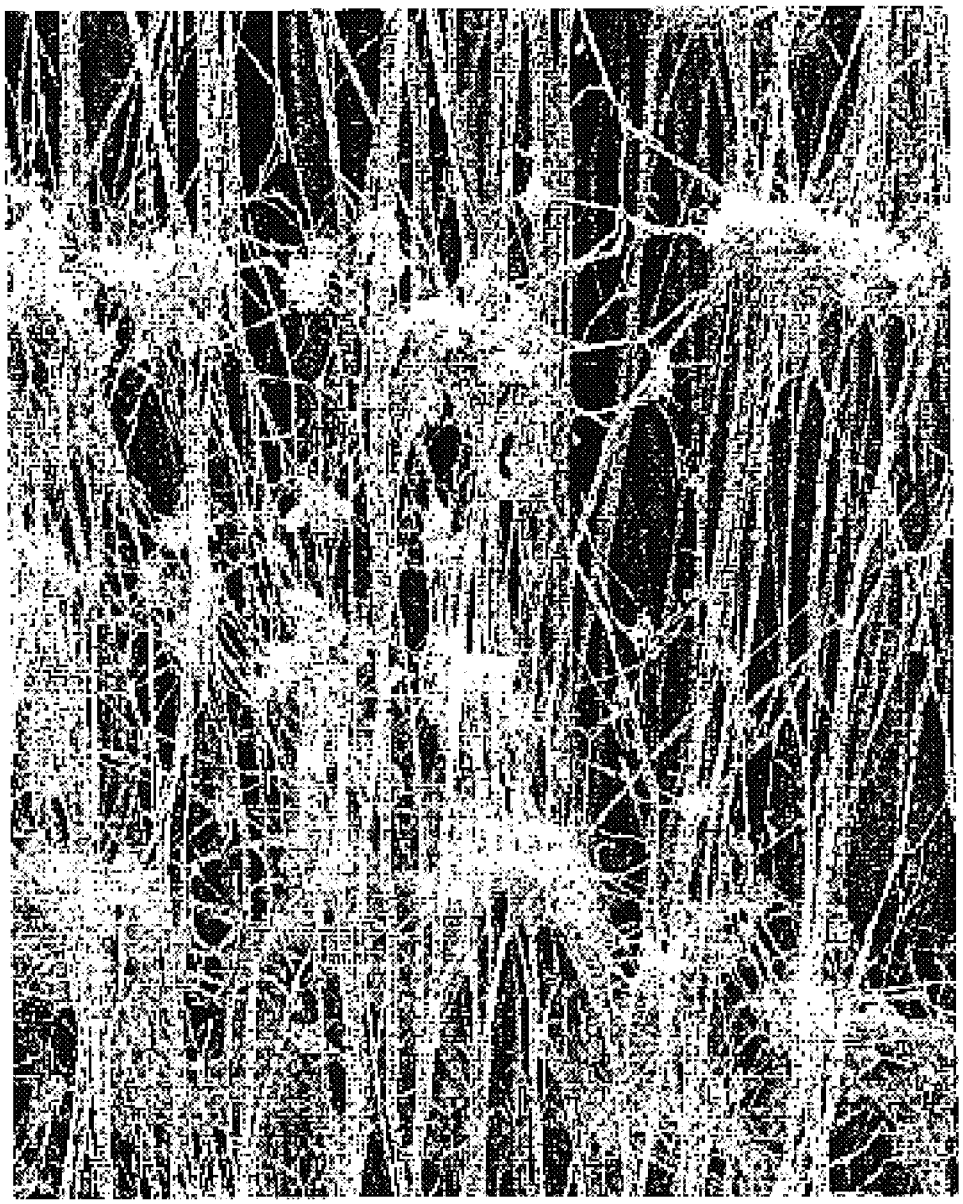
FIG. 4 is a Scanning Electron Micrograph taken at 2000× magnification of the membrane used in Comparative Example 4.
Figure 5:
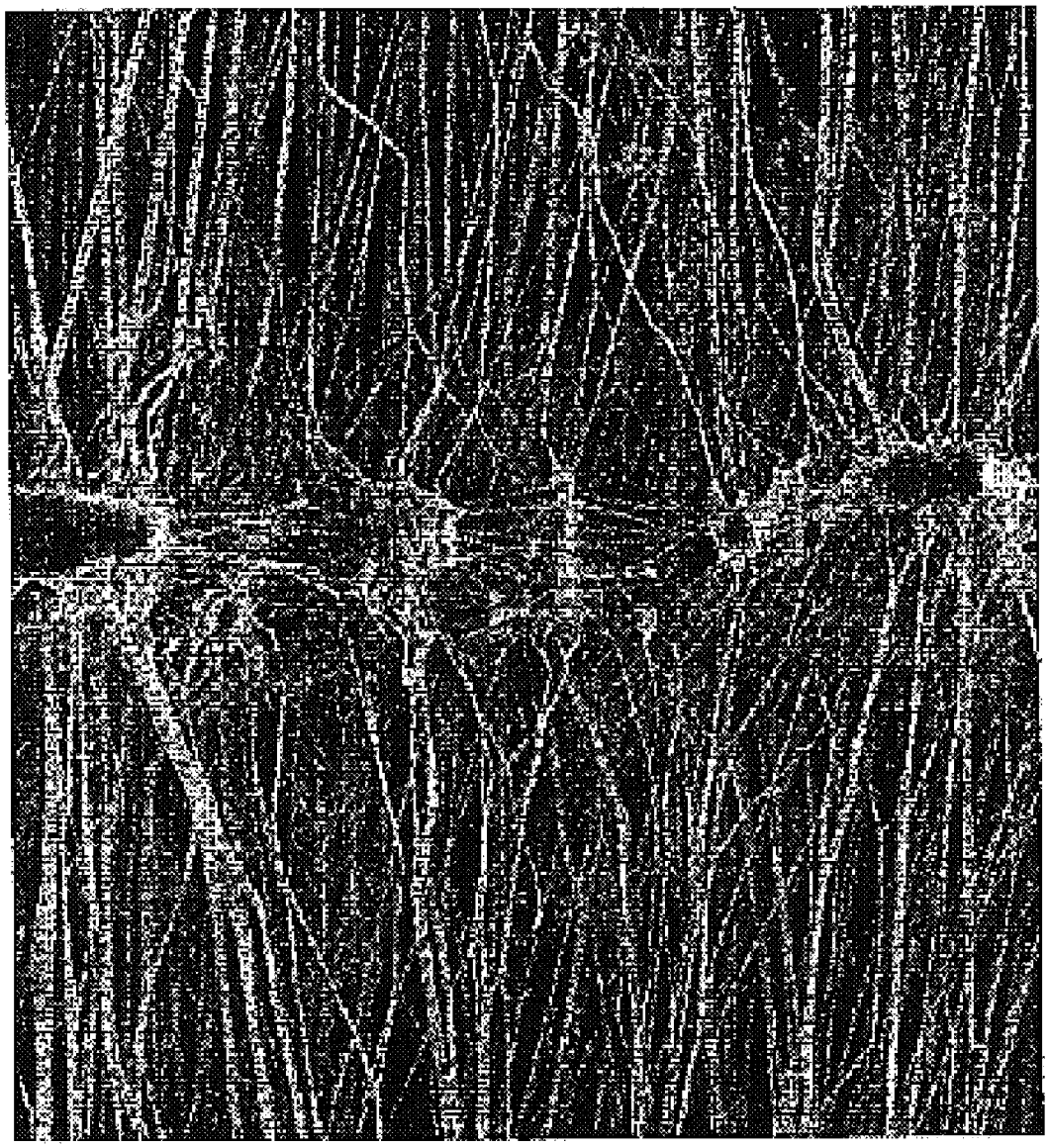
FIG. 5 is a Scanning Electron Micrograph taken at 2000× magnification of the membrane used in Comparative Example 5.
Figure 7:
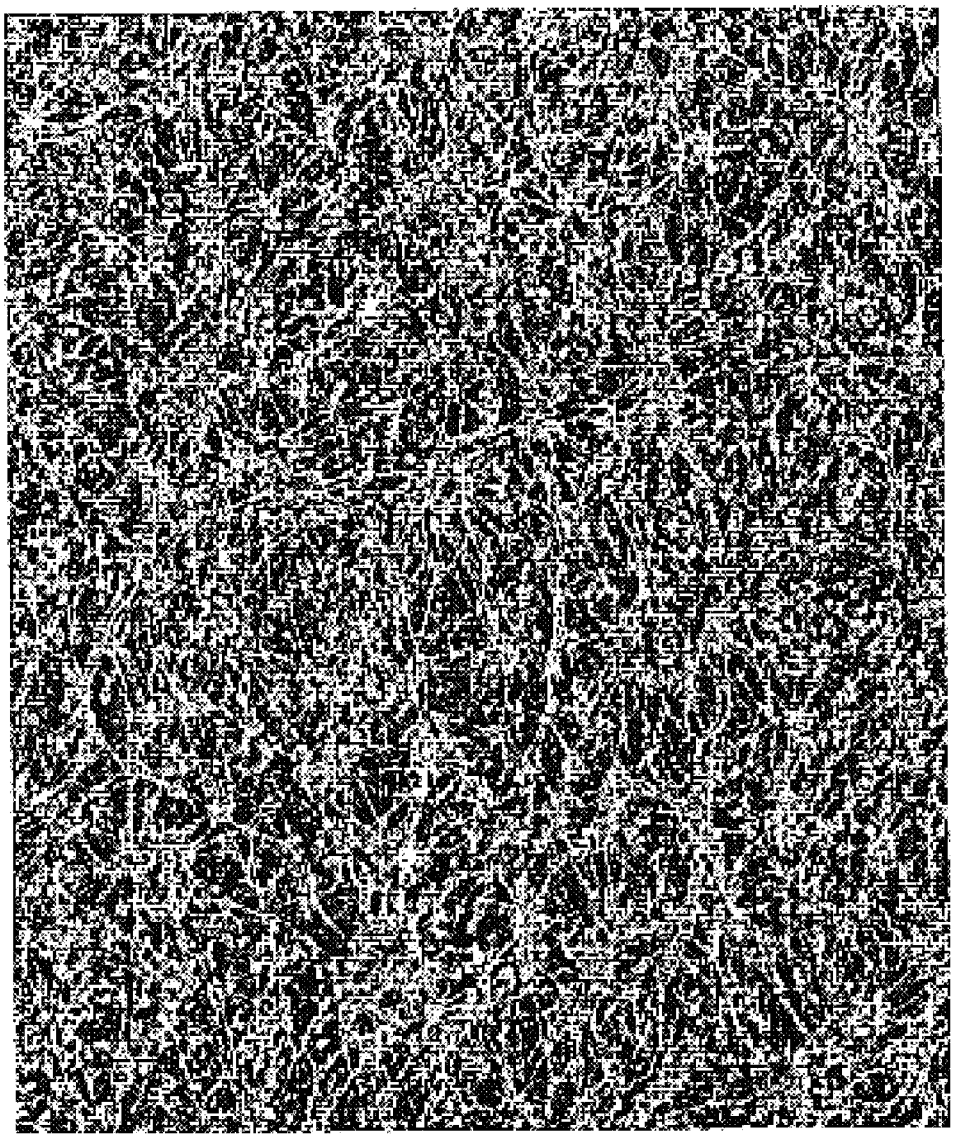
FIG. 7 is a Scanning Electron Micrograph taken at 2000× magnification of the membrane used in Comparative Example 7.

| Example | SEM of Membrane | Composite $K_q$ MPa(M)$^{0.5}$ | Membrane Tensile Modulus MPa | | Resin | Weight % ePTFE |
|---|---|---|---|---|---|---|
| Comparative Example 1 | FIG. 1 | X = 3.70 +/− 0.06<br>Y = 3.42 +/− 0.12 | Longitudinal:<br>Transverse: | 14<br>57 | A | 49 |
| Comparative Example 2 | FIG. 2 | X = 3.20 +/− 0.07<br>Y = 3.11 +/− 0.08 | Longitudinal:<br>Transverse: | 12<br>96 | A | 27 |
| Comparative Example 3 | FIG. 3 | X = 2.08 +/− 0.04<br>Y = 2.74 +/− 0.05 | Longitudinal:<br>Transverse: | 73<br>7 | A | 16 |
| Comparative Example 4 | FIG. 4 | X = 1.94 +/− 0.05<br>Y = 3.08 +/− 0.09 | Longitudinal:<br>Transverse: | 119<br>6 | A | 19 |
| Comparative Example 5 | FIG. 5 | X = 2.11 +/− 0.04<br>Y = 3.31 +/− 0.08 | Longitudinal:<br>Transverse: | 133<br>1 | A | 27 |
| Comparative Example 6 | FIG. 6 | X = 3.27 +/− 0.09<br>Y = 2.98 +/− 0.02 | Longitudinal:<br>Transverse: | 16<br>76 | A | 35 |
| Comparative Example 7 | FIG. 7 | X = 3.06 +/− 0.04<br>Y = 4.41 +/− 0.11 | Longitudinal:<br>Transverse: | 86<br>29 | A | 32 |

TABLE 2

Figure 8:
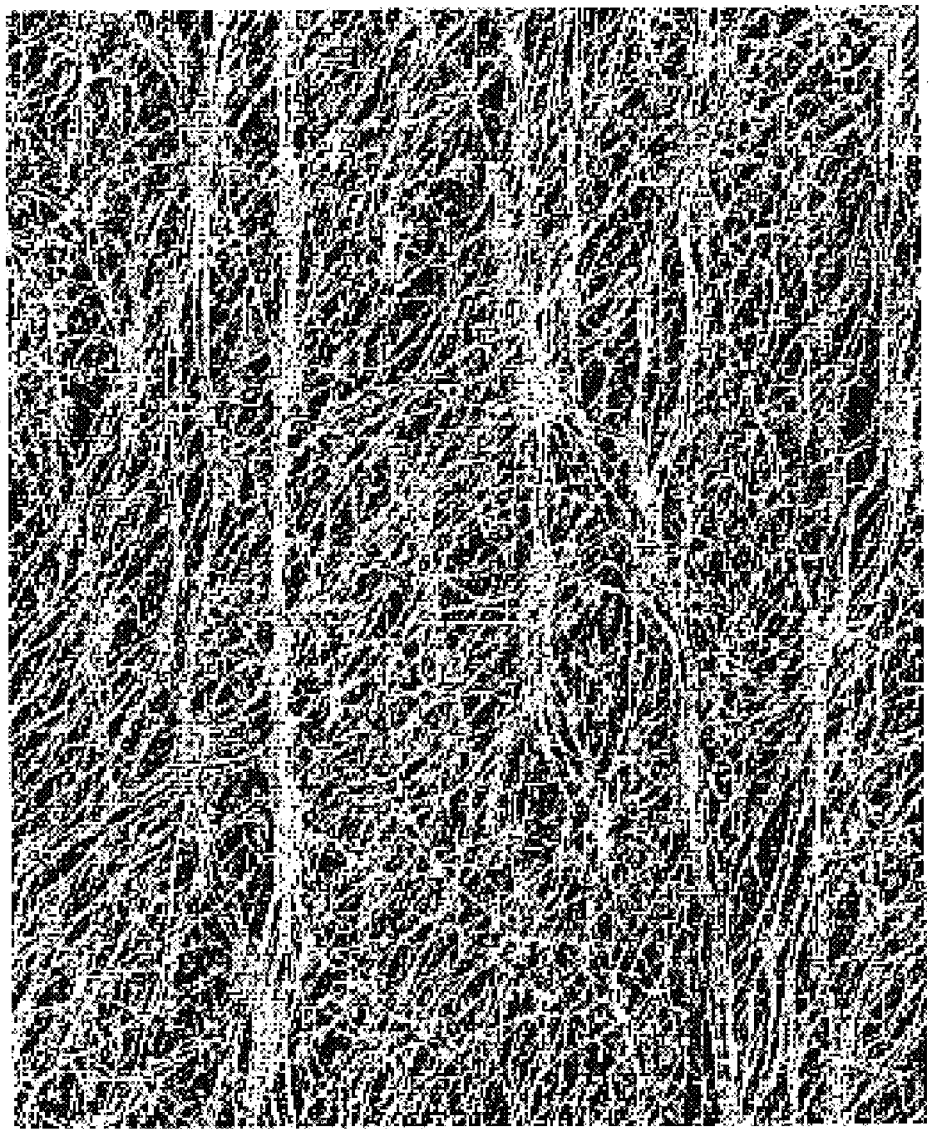
FIG. 8 is a Scanning Electron Micrograph taken at 2000× magnification of the membrane used in Example 1.
Figure 9:
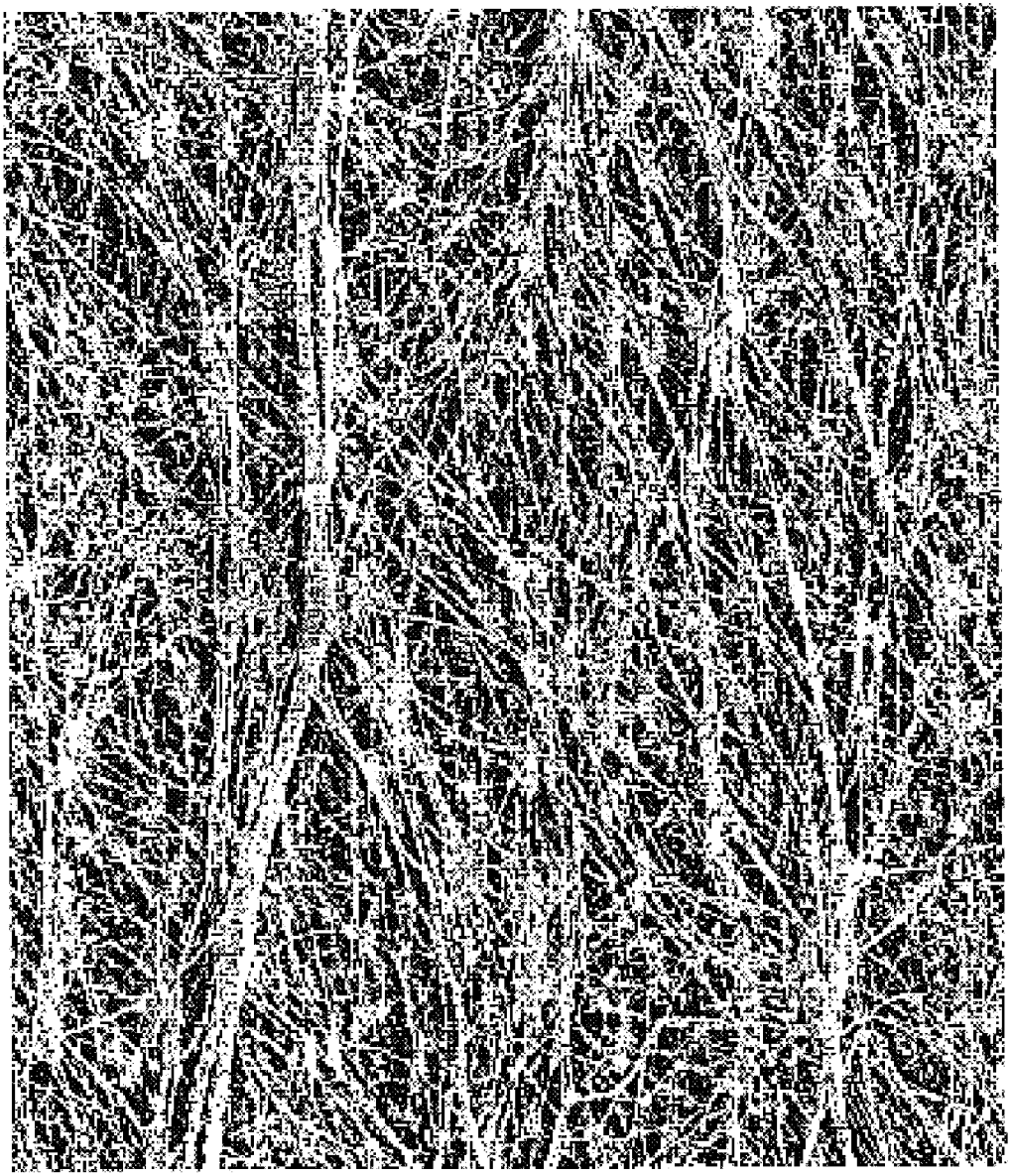
FIG. 9 is a Scanning Electron Micrograph taken at 2000× magnification of the membrane used in Example 2.
Figure 10:
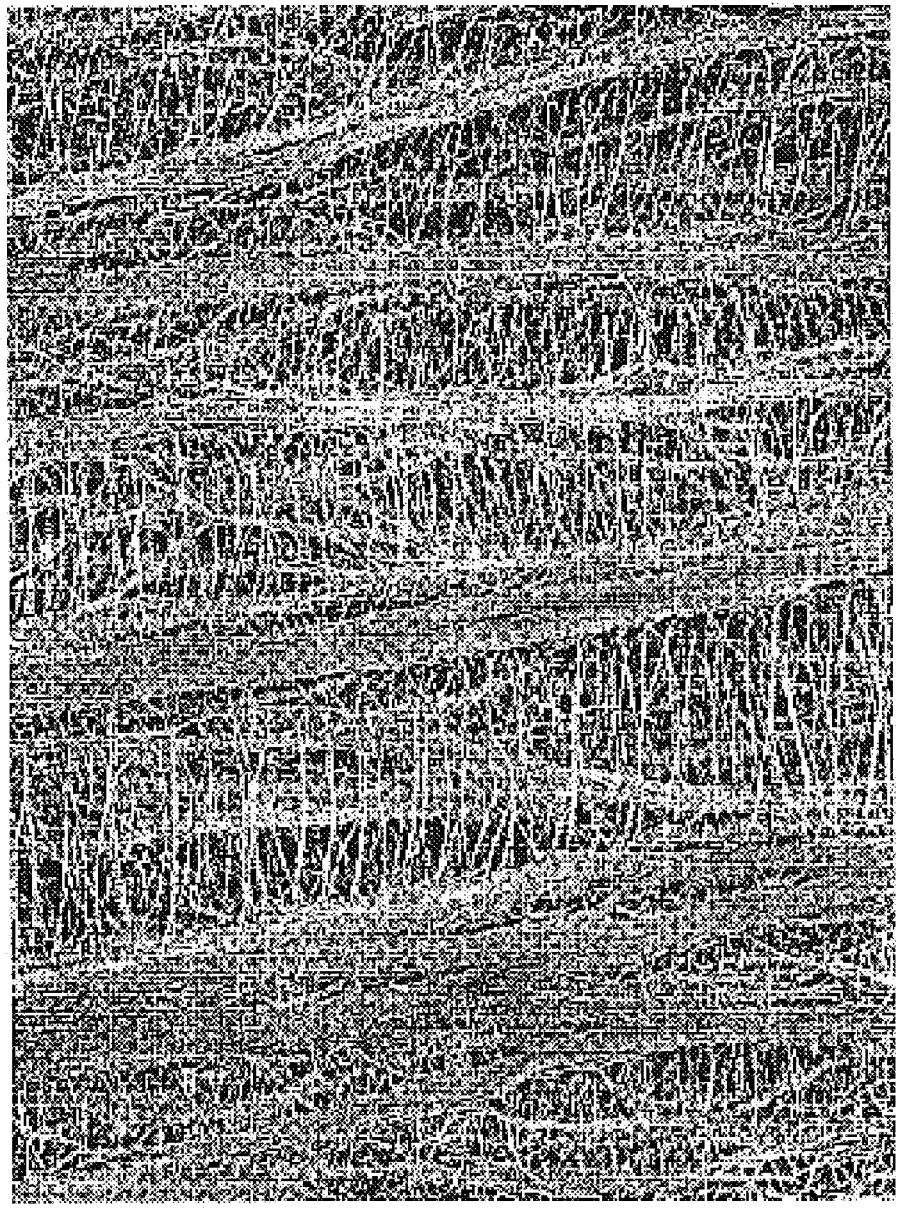
FIG. 10 is a Scanning Electron Micrograph taken at 2000× magnification of the membrane used in Example 3.
Figure 11:
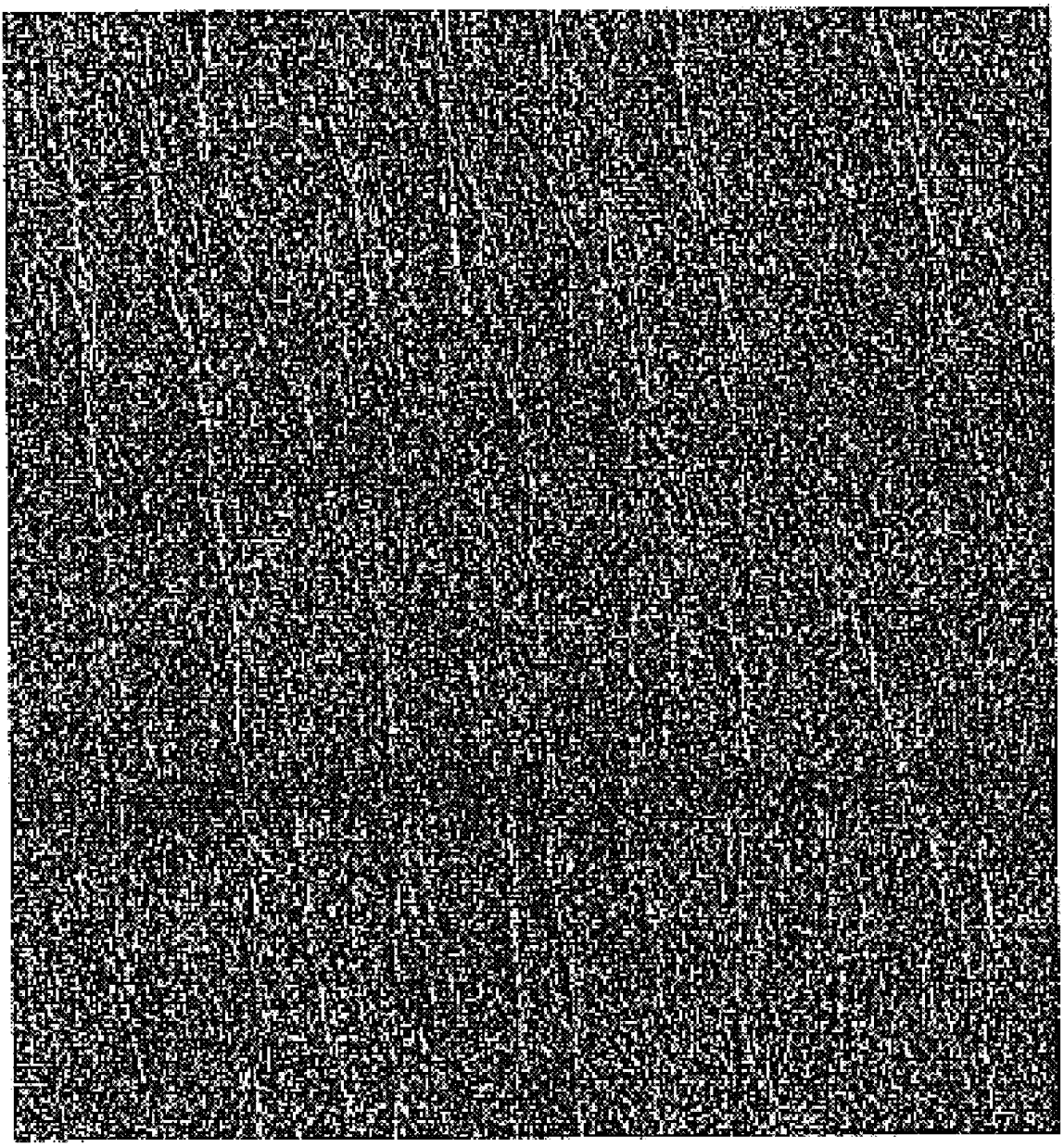
FIG. 11 is a Scanning Electron Micrograph taken at 2000× magnification of the membrane used in Example 4.
Figure 12:
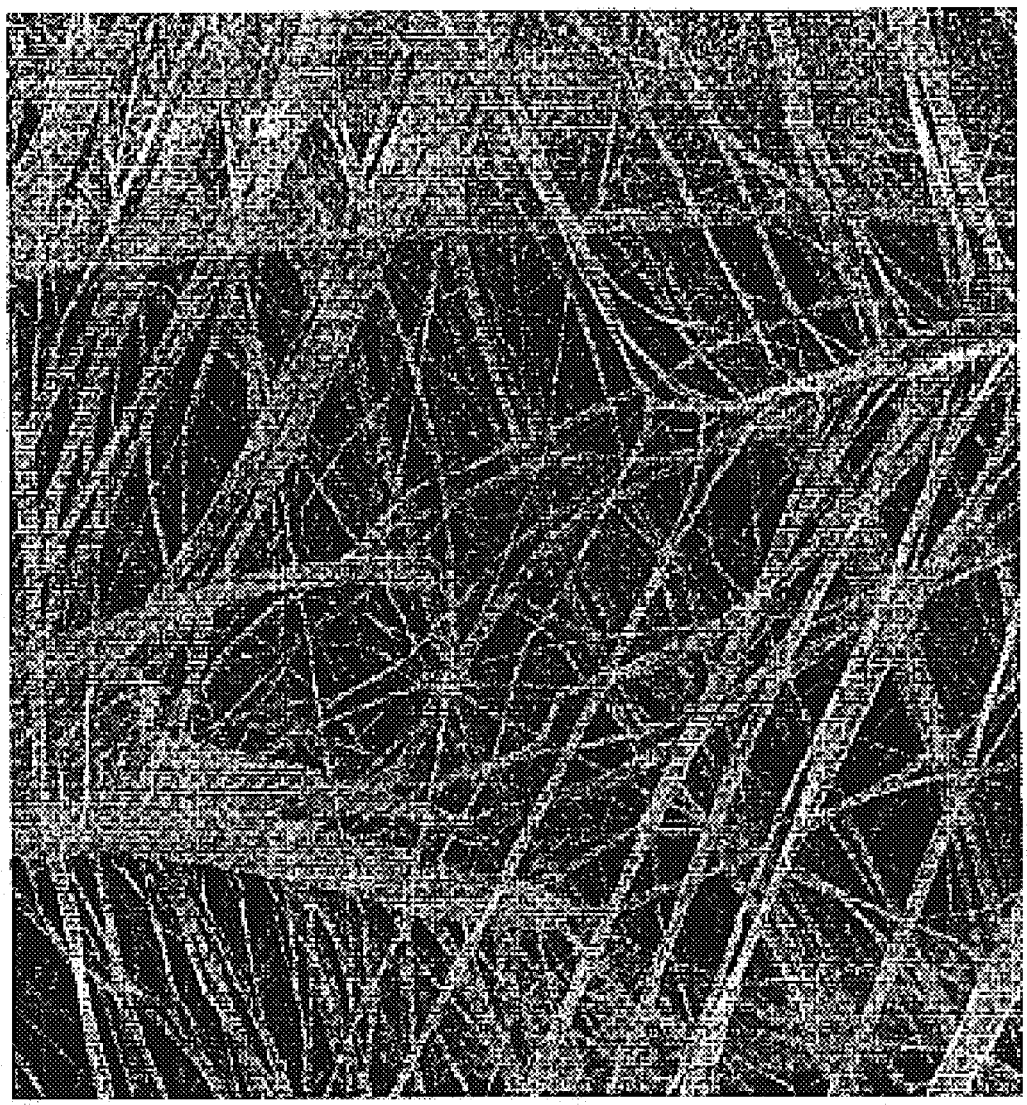
FIG. 12 is a Scanning Electron Micrograph taken at 2000× magnification of the membrane used in Example 5.
Figure 13:
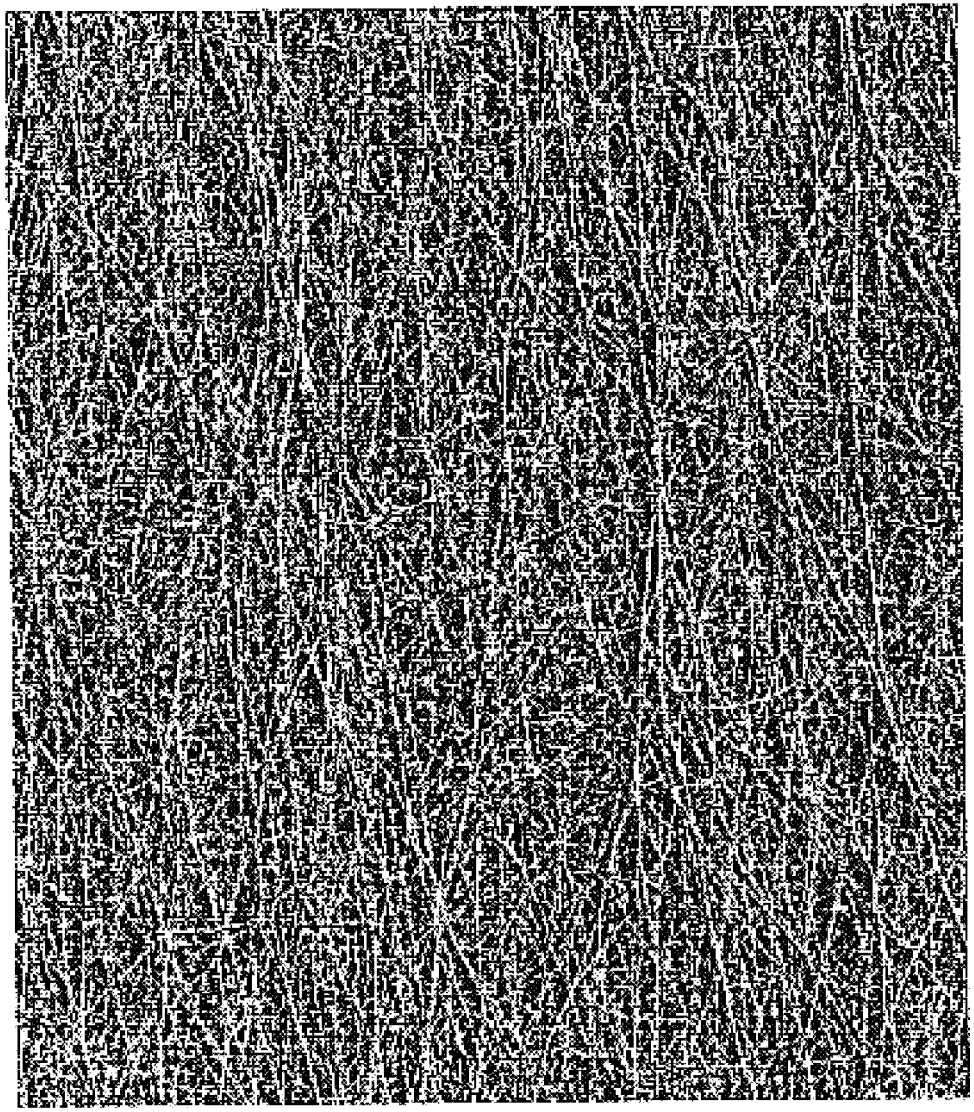
FIG. 13 is a Scanning Electron Micrograph taken at 2500× magnification of the membrane used in Example 6.

| Example | SEM of Membrane | Composite $K_q$ MPa(M)$^{0.5}$ | Membrane Tensile modulus MPa | | Resin | Weight % ePTFE |
|---|---|---|---|---|---|---|
| Example 1 | FIG. 8 | X = 2.89 +/− 0.03<br>Y = 5.85 +/− 0.09 | Longitudinal:<br>Transverse: | 257<br>6 | A | 33 |
| Example 2 | FIG. 9 | X = 2.79 +/− 0.03<br>Y = 6.28 +/− 0.66 | Longitudinal:<br>Transverse: | 393<br>4 | A | 18 |
| Example 3 | FIG. 10 | X = 6.14 +/− 0.19<br>Y = 2.85 +/− 0.03 | Longitudinal:<br>Transverse: | 85<br>429 | A | 29 |
| Example 4 | FIG. 11 | X = 3.60 +/− 0.03<br>Y = 5.99 +/− 0.13 | Longitudinal:<br>Transverse: | 286<br>21 | A | 25 |
| Example 5 | FIG. 12 | X = 4.66 +/− 0.12<br>Y = 3.42 +/− 0.09 | Longitudinal:<br>Transverse: | 143<br>96 | A | 25 |
| Example 6 | FIG. 13 | X = 8.90 +/− 0.32<br>Y = 4.64 +/− 0.12 | Longitudinal:<br>Transverse: | 805<br>82 | A | 34 |

TABLE 2-continued

| Example | SEM of Membrane | Composite $K_q$ MPa(M)$^{0.5}$ | Membrane Tensile modulus MPa | | Resin | Weight % ePTFE |
|---|---|---|---|---|---|---|
| Example 7 | — | X = 1.90 +/− 0.06<br>Y = 3.41 +/− 0.16 | Longitudinal:<br>Transverse: | 320<br>16 | B | 27 |
| Example 8 | — | X = 3.97 +/− 0.22<br>Y = 3.65 +/− 0.12 | Longitudinal:<br>Transverse: | 128<br>293 | B | 37 |
| Example 9 | — | X = 2.64 +/− 0.13<br>Y = 3.99 +/− 0.23 | Longitudinal:<br>Transverse: | 262<br>131 | B | 37 |

The ePTFE membranes were characterized as to tensile modulus as follows. Specimens were die cut to 15 mm×165 mm strips. Tensile tests were carried out on an Instron tensile strength tester. Machine parameters were set as follows. Cross head speed: 508 mm/minute. Full scale load range: 0.1 kN. Grip distance: 50 mm. Testing was conducted at ambient conditions. Young's modulus was calculated with automatically defined limits (Series IX automated Materials Testing System software). Sample thickness was measured using a Kafer FZ1000/30 snap gauge. Measurements were taken in at least four areas of each specimen.

Figure 15:
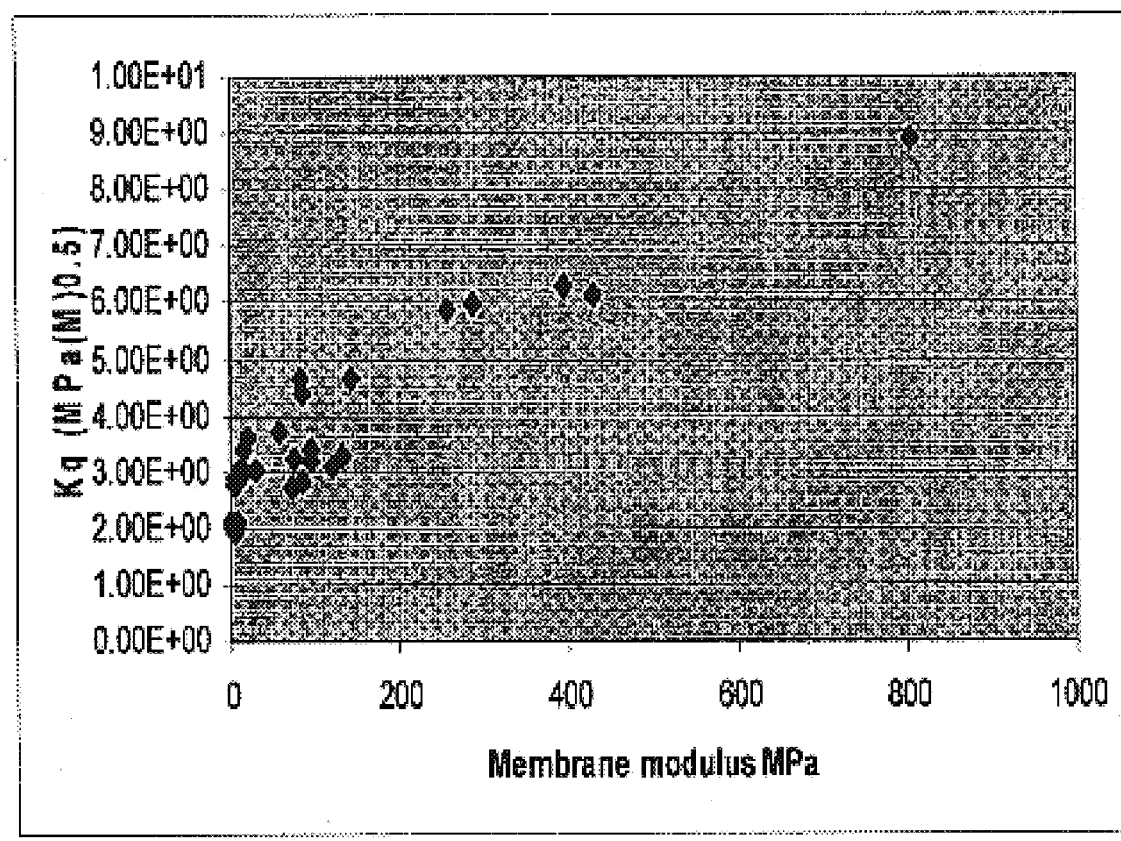
FIG. 15 is a graph plotting composite Kq value versus membrane modulus for several Examples of the invention and several Comparatives Examples.

FIG. 15 is a plot of composite Kq values versus membrane modulus values for each composite formed using Resin A.

Figure 16:
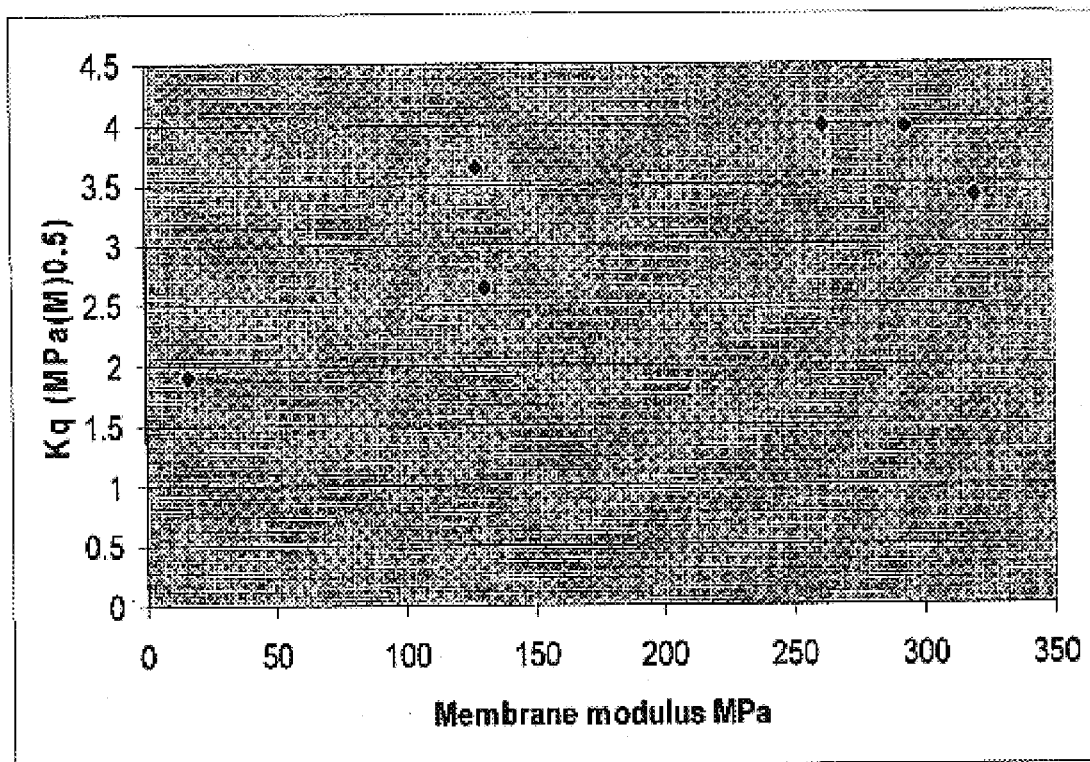
FIG. 16 is a graph plotting composite Kq value versus membrane modulus for several Examples of the invention.

FIG. 16 is a plot of composite Kq values versus membrane modulus values for each composite formed using Resin B.

The above examples show that using membranes according to the invention results in composites having surprisingly high toughness.

Example 10

Figure 14:
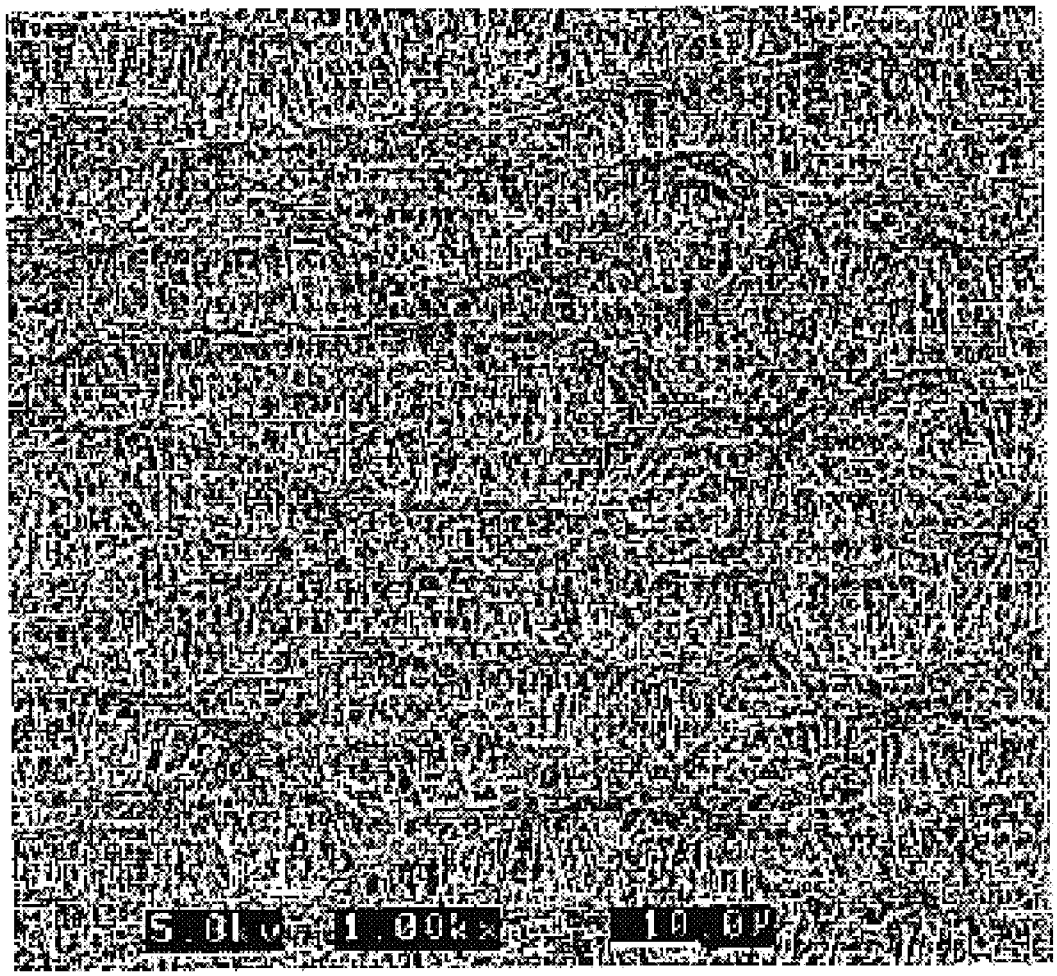
FIG. 14 is a Scanning Electron Micrograph taken at 1000× magnification of the membrane used in Example 10.

Resin B, used in Examples 7, 8 and 9 (and having a room temperature flexural modulus of 4.9 GPa), was imbibed into an expanded PTFE membrane having a transverse tensile modulus of 119 MPa and a longitudinal tensile modulus of 56 MPa. FIG. 14 is a Scanning Electron Micrograph taken at 1000× magnification of the membrane used in this Example. The resin was imbibed into the porosity of the membrane substantially as described in Examples 1–9 and Comparative Examples 1–7, to obtain a composite body. The room temperature flexural modulus of the composite was 4.5 GPa (as measured parallel to the membrane transverse direction). The room temperature flexural modulus of the composite was measured using the same method as was used to measure the room temperature flexural modulus of Resin A, above. Thus, this example demonstrates formation of a composite where the ratio of the resin room temperature flexural modulus to the composite room temperature flexural modulus (measured parallel to the membrane transverse direction) is greater than 1.

Examples 11 and 12 ePTFE Membranes prepared as described in U.S. Pat. No. 5,476,589 were impregnated with polystyrene using a solution in methyl ethyl ketone. Each membrane was impregnated by running the membrane through the polymer solution followed by drying off of the solvent. Polystyrene content was 70 +/−10% by weight of the final composite. Plaques were prepared by laying up prepreg inside of a ⅛" thick frame mold. The mold was covered with PTFE film on both sides and pressed at 200 psi (1.378 KPa). The thermal cycle was 200° C. for 1 hour for Example 11 (low molecular weight polystyrene (a blend of Mw=200,000 and 4,000)) and 250° C. for 1 hour for Example 12 (high molecular weight polystyrene (a Mw of 280,000)). As used herein Mw is weight average molecular weight. Both polystyrenes were obtained from Aldrich Chemical Company, Milwaukee, Wis. and are available as Aldrich Cat# 33, 165-1 and Aldrich Cat# 18, 242-7, respectively.

The ePTFE membrane used for each composite had a longitudinal membrane tensile modulus of 241 MPa and a transverse tensile modulus of 65 MPa The room temperature flexural modulus of the high molecular weight polystyrene was measured to be 3.8 GPa while that of the composite was measured to be 3.2 GPa parallel to the membrane transverse direction and 3.5 GPa parallel to the membrane longitudinal direction. Room temperature flexural modulus was measured using the same method as was used to measure the room temperature flexural modulus of Resin A, above. Kq measurements were made as described in the earlier Examples. Toughness data for each example is set forth in Table 3.

TABLE 3

| Example | Kq Neat resin | Kq Composite - X direction | Kq Composite - Y direction (90 degrees to the X-direction) |
|---|---|---|---|
| Example 11 | 0.12 +/− 0.02 MPa(m)0.5 | 1.2 +/− 0.18 MPa(m)0.5 | 2.6 +/− 0.45 MPa(m)0.5 |
| Example 12 | 2.2 +/− 0.26 MPa(m)0.5 | 3.5 +/− 0.16 MPa(m)0.5 | 4.2 +/− 0.32 MPa(m)0.5 |

The above example demonstrates that using membranes according to the invention results in composites having surprisingly high toughness.

Examples 13 and 14 and Comparative Example 8

900 um thick test laminate were prepared using commercially available MICROLAM® 410 Dielectric, available from W.L. Gore and Associates, Inc., Elkton, Md. The laminate were prepared from stacked layers of MICROLAM® 410 Dielectric, pressed under 325 psi (2.24 KPa) and cured at 350° F. (177° C.) for 1 hour followed by 435° F. (224° C.) for 2 hours. Specimens measuring 50 mm×12.5 mm were cut from the laminate. Comparative Example 8 contained only layers of MICROLAM® 410 Dielectric. Examples 13 and 14 contained single outer plies of high modulus ePTFE membrane, with the remainder being layers of MICROLAM® 410 Dielectric. Examples 13 and 14 were prepared by pressing the outer ePTFE layer with the inner MICROLAM® 410 Dielectric layers during lamination. During lamination, some of the the resin from the MICROLAM® 410 Dielectric infiltrated at least some of the porosity of the outer layer membrane. The resin component of the MICROLAM® 410 Dielectric that infiltrated some of the outer layer membrane porosity is essentially the same as Resin B, above, and had a room temperature flexural modulus of about 4.9 GPa. In Example 13 the outer layer membrane had a longitudinal tensile modulus of 805 MPa and a transverse tensile modulus of 82 MPa. In Example 14 the outer layer membrane had a longitudinal tensile modulus of 570 MPa and a transverse tensile modulus of 22 MPa . Thus, the outer layers of Example 13 and Example 14 are composites according to the invention.

Test specimens from each of Comparative Example 8 and Examples 13 and 14 were then loaded in three point bend at a cross head speed of 0.1 mm/minute and a span of 2.54 cm. Flexural strength was calculated using peak load. Strength was calculated as follows and data is listed in Table 4:

$$strength = 3PL/2bd^2$$

Where P=peak load, L=span, b=specimen width, d=specimen depth.

TABLE 4

| Example Number | Flexural Strength (measured with sample long axis parallel to the longitudinal membrane direction) (MPa) | Flexural Strength (measured at 90 degrees from longitudinal membrane direction) (MPa) |
| --- | --- | --- |
| Comparative Example 8 | 111 (+/−3) | 86 (+/−5) |
| Example 13 | 126 (+/−4) | 118 (+/−9) |
| Example 14 | 124 (+/−6) | 110 (+/−4) |

These examples demonstrate that composites according to the invention can be used as an outer layer in laminates to toughen such laminates.

While particular embodiments of the present invention have been illustrated and described herein, the present invention should not be limited to such illustrations and descriptions. It should be apparent that changes and modifications may be incorporated and embodied as part of the present invention within the scope of the following claims.

What is claimed is:

1. A composite comprising a porous polymeric membrane, wherein the porosity of the membrane is at least partially filled with resin, the resin having a room temperature flexural modulus of greater than about 1 GPa, and wherein the membrane satisfies the following equation: 75 MPa<(longitudinal membrane tensile modulus+transverse membrane tensile modulus)/2.

2. The composite of claim 1, wherein the resin comprises a material selected from the group consisting of metals, metalloids, ceramics, polymeric materials, and combinations thereof.

3. The composite of claim 1, wherein the resin comprises polymeric material.

4. The composite of claim 3, wherein the polymeric material comprises thermoplastic polymer.

5. The composite of claim 3, wherein the polymeric material comprises thermoset polymer.

6. The composite of claim 3, wherein the ratio of the room temperature flexural modulus of the resin to the room temperature flexural modulus of the composite, measured in the direction of the higher of the transverse and longitudinal moduli, is greater than or equal to about 1.

7. The composite of claim 3, further including at least one filler material.

8. The composite of claim 1, wherein the membrane comprises a material selected from the group consisting of vinyl polymers, styrenes, acrylates, methacrylates, polyethylenes, polypropylenes, polyacrylonitriles, polyacrylamides, poly vinyl chlorides, fluoropolymers, condensation polymers, polysulfones, polyimides, polyamides, polycarbonates, polysulfides, polyesters, polyanhydrides, polyacetals, polyurethanes, polyureas, cellulose, cellulose derivatives, polysaccharides, pectinic polymers and derivatives, alginic polymers and derivatives, chitins and derivatives, phenolics, aldehyde polymers, polysiloxanes and derivatives, and combinations thereof.

9. The composite of claim 8, wherein the fluoropolymer is polytetraflouroethylene.

10. The composite of claim 9, wherein the polytetraflouroethylene is expanded polytetrafluoroethylene.

11. The composite of claim 10, wherein the expanded polytetraflouroethylene is substantially void of nodal material.

12. The composite of claim 1, wherein the composite is joined to one or more metal layers in the form of a laminate.

13. The composite of claim 12, wherein the one or more metals are selected from the group consisting of aluminum, copper, gold, tin, silver, lead and combinations thereof.

14. The composite of claim 1, wherein the composite is joined to one or more capacitance layer materials.

15. The composite of claim 1, wherein the composite is a layer of a laminate.

16. The composite of claim 15, wherein the composite is an interface adhesive layer in the laminate.

17. The composite of claim 15, wherein the composite is an outer layer on the laminate.

18. The composite of claim 15, wherein the laminate additionally includes at least one layer of a material selected from metal and capacitance materials.

19. The composite of claim 18, wherein the metal is selected from the group consisting of aluminum, copper, gold, tin, silver, lead and combinations thereof.

20. A printed circuit board comprising the composite of claim 1.

21. An electronic substrate comprising the composite of claim 1.

22. A chip package substrate comprising the composite of claim 1.

23. A silicon wafer comprising the composite of claim 1.

24. The composite of claim 1, wherein the resin exhibits brittle failure.

25. The composite of claim 1, wherein the glass transition temperature of the resin is equal to the glass transition temperature of the composite.

26. The composite of claim 1, wherein the composite is laminated to at least one layer of high modulus fiber containing material.

27. The composite of claim 26, wherein the high modulus fiber is selected from the group consisting of glass fiber, carbon fiber, ceramic fiber, and combinations thereof.

28. A sporting goods article comprising the composite of claim 1.

29. The sporting goods article of claim 28, wherein the sporting goods article is selected from the group consisting of fishing equipment, hunting equipment, golf equipment, tennis equipment, skiing equipment, track and field equipment, basketball equipment, football equipment, soccer equipment, lacrosse equipment, and hockey equipment.

30. An aerospace part comprising the composite of claim 1.

31. The aerospace part of claim 30, wherein the aerospace part is selected from the group consisting of aircraft panels, safety devices, fan blades, control surfaces, and struts.

32. An armor material comprising the composite of claim 1, wherein the armor material is selected from the group consisting of body armor and vehicle armor.

33. A composite comprising a porous polymeric membrane, wherein the porosity of the membrane is at least partially filled with resin and the membrane satisfies the following equation: 75 MPa<(longitudinal membrane tensile modulus+transverse membrane tensile modulus)/2, and wherein the ratio of the room temperature flexural modulus of the resin to the room temperature flexural modulus of the composite, measured in the direction of the higher of the transverse and longitudinal moduli, is greater than or equal to about 1.

34. The composite of claim 33, wherein the resin comprises a material selected from the group consisting of metals, metalloids, ceramics, polymeric materials, and combinations thereof.

35. The composite of claim 33, wherein the resin comprises polymeric material.

36. The composite of claim 35, wherein the polymeric material comprises thermoplastic polymer.

37. The composite of claim 35, wherein the polymeric material comprises thermoset polymer.

38. The composite of claim 33, further including at least one filler material.

39. The composite of claim 33, wherein the membrane comprises a material selected from the group consisting of vinyl polymers, styrenes, acrylates, methacrylates, polyethylenes, polypropylenes, polyacrylonitriles, polyacrylamides, poly vinyl chlorides, fluoropolymers, condensation polymers, polysulfones, polyimides, polyamides, polycarbonates, polysulfides, polyesters, polyanhydrides, polyacetals, polyurethanes, polyureas, cellulose, cellulose derivatives, polysaccharides, pectinic polymers and derivatives, alginic polymers and derivatives, chitins and derivatives, phenolics, aldehyde polymers, polysiloxanes and derivatives, and combinations thereof.

40. The composite of claim 39, wherein the fluoropolymer is polytetrafluoroethylene.

41. The composite of claim 40, wherein the polytetrafluoroethylene is expanded polytetrafluoroethylene.

42. The composite of claim 41, wherein the expanded polytetrafluoroethylene is substantially void of nodal material.

43. The composite of claim 33, wherein the composite is joined to one or more metal layers in the form of a laminate.

44. The composite of claim 43, wherein the one or more metals are selected from the group consisting of aluminum, copper, gold, tin, silver, lead, and combinations thereof.

45. The composite of claim 33, wherein the composite is joined to one or more capacitance layer materials.

46. The composite of claim 33, wherein the composite is a layer of a laminate.

47. The composite of claim 46, wherein the composite is an interface adhesive layer in the laminate.

48. The composite of claim 46, wherein the composite is an outer layer on the laminate.

49. The composite of claim 46, wherein the laminate additionally includes at least one layer of a material selected from metal and capacitance materials.

50. The composite of claim 46, wherein the metal is selected from the group consisting of aluminum, copper, gold, tin, silver, lead, and combinations thereof.

51. The composite of claim 50, wherein the metal is copper.

52. A printed circuit board comprising the composite of claim 33.

53. An electronic substrate comprising the composite of claim 33.

54. A chip package substrate comprising the composite of claim 33.

55. A silicon wafer comprising the composite of claim 33.

56. The composite of claim 33, wherein the resin exhibits brittle failure.

57. The composite of claim 33, wherein the composite is laminated to at least one layer of high modulus fiber containing material.

58. The composite of claim 57, wherein the high modulus fiber is selected from the group consisting of glass fiber, carbon fiber, ceramic fiber, and combinations thereof.

59. A sporting goods article comprising the composite of claim 33.

60. The sporting goods article of claim 59, wherein the sporting goods article is selected from the group consisting of fishing equipment, hunting equipment, golf equipment, tennis equipment, skiing equipment, track and field equipment, basketball equipment, football equipment, soccer equipment, lacrosse equipment, and hockey equipment.

61. An aerospace part comprising the composite of claim 33.

62. The aerospace part of claim 61, wherein the aerospace part is selected from the group consisting of aircraft panels, safety devices, fan blades, control surfaces, and struts.

63. The composite of claim 33, wherein the resin has a room temperature flexural modulus of greater than about 1 GPa.

64. An armor material comprising the composite of claim 33, wherein the armor material is selected from the group consisting of body armor and vehicle armor.

65. A composite comprising a porous expanded polytetrafluoroethylene membrane, wherein the porosity of the membrane is at least partially filled with resin, the resin having a room temperature flexural modulus of greater than about 1 GPa, and wherein the membrane satisfies the following equation: 75 MPa<(longitudinal membrane tensile modulus+transverse membrane tensile modulus)/2.

66. The composite of claim 65, wherein the resin comprises a material selected from the group consisting of metals, metalloids, ceramics, polymeric materials, and combinations thereof.

67. The composite of claim 66, wherein the resin comprises polymeric material.

68. The composite of claim 67, wherein the polymeric material comprises thermoplastic polymer.

69. The composite of claim 67, wherein the polymeric material comprises thermoset polymer.

70. The composite of claim 65, wherein the ratio of the room temperature flexural modulus of the resin to the room temperature modulus of the composite, measured in the direction of the higher of the transverse and longitudinal moduli, is greater than or equal to about 1.

71. The composite of claim 65, further including at least one filler material.

72. The composite of claim 65, wherein the membrane is substantially void of nodal material.

73. The composite of claim 65, wherein the composite is joined to one or more metal layers in the form of a laminate.

74. The composite of claim 73, wherein the one or more metals are selected from the group consisting of aluminum, copper, gold, tin, silver, lead and combinations thereof.

75. The composite of claim 65, wherein the composite is joined to one or more capacitance layer materials.

76. The composite of claim 65, wherein the composite is a layer of a laminate.

77. The composite of claim 76, wherein the composite is an interface adhesive layer in the composite.

78. The composite of claim 76, wherein the composite is an outer layer on the laminate.

79. The composite of claim 76, wherein the laminate additionally includes at least one layer of a material selected from metal and capacitance materials.

80. The composite of claim 76, wherein the metal is selected from the group consisting of aluminum, copper, gold, tin, silver, lead and combinations thereof.

81. A printed circuit board comprising the composite of claim 65.

82. An electronic substrate comprising the composite of claim 65.

83. A chip package substrate comprising the composite of claim 65.

84. A silicon wafer comprising the composite of claim 65.

85. The composite of claim 65, wherein the resin exhibits brittle failure.

86. The composite of claim 65, wherein the glass transition temperature of the resin is equal to the glass transition temperature of the composite.

87. The composite of claim 65, wherein the ratio of the room temperature flexural modulus of the resin divided by the room temperature flexural modulus of the composite measured in the direction parallel to the higher modulus direction of the membrane is greater than about 1.

88. The composite of claim 65, wherein the composite is laminated to at least one layer of high modulus fiber containing material.

89. The composite of claim 88, wherein the high modulus fiber is selected from the group consisting of glass fiber, carbon fiber, ceramic fiber, and combinations thereof.

90. An electronic chip package comprising a laminated substrate, wherein the laminated substrate includes at least one conductive layer and at least one dielectric layer bonded to the conductive layer, the dielectric layer comprising a porous, expanded polytetrafluoroethylene membrane wherein the porosity of the membrane is at least partially filled with resin, the resin has a room temperature flexural modulus of greater than about 1 GPa, and the membrane satisfies the following equation: 75 MPa<(longitudinal membrane tensile modulus+transverse membrane tensile modulus)/2.

91. The electronic chip package of claim 90, further comprising alternating layers of the at least one conductive layer and the at least one dielectric layer.

92. The electronic chip package of claim 91, further comprising at least one via therein.

93. The electronic chip package of claim 90, wherein the resin comprises polymeric material.

94. The electronic chip package of claim 93, wherein the polymeric material comprises thermoplastic polymer.

95. The electronic chip package of claim 93, wherein the polymeric material comprises thermoset polymer.

96. The electronic chip package of claim 93, wherein the conductive layer comprises a material selected from the group consisting of aluminum, copper, gold, tin, silver, lead, and combinations thereof.

97. The electronic chip package of claim 96, wherein the conductive layer comprises copper.

98. The electronic chip package of claim 96, wherein the expanded polytetraflouroethylene membrane is substantially void of nodal material.

99. The electronic chip package of claim 96, wherein the ratio of the room temperature flexural modulus of the resin to the room temperature flexural modulus of the composite, measured in the direction of the higher of the transverse and longitudinal moduli, is greater than or equal to 1.

* * * * *